United States Patent
Yasuoka et al.

(10) Patent No.: US 8,772,896 B2
(45) Date of Patent: Jul. 8, 2014

(54) SEMICONDUCTOR PHOTODETECTOR THAT CAUSES AVALANCHE MULTIPLICATION TO OCCUR ONLY AT PHOTODETECTOR PORTION LOCATED AT CENTRAL PORTION OF MESA STRUCTURE

(75) Inventors: Nami Yasuoka, Kawasaki (JP); Haruhiko Kuwatsuka, Kawasaki (JP); Toru Uchida, Nakakoma (JP); Yoshihiro Yoneda, Nakakoma (JP)

(73) Assignees: Fujitsu Limited, Kawasaki (JP); Sumitomo Electric Device Innovations, Inc., Yokohama (JP)

( * ) Notice: Subject to any disclaimer, the term of this patent is extended or adjusted under 35 U.S.C. 154(b) by 727 days.

(21) Appl. No.: 12/926,484

(22) Filed: Nov. 22, 2010

(65) Prior Publication Data
US 2011/0068428 A1    Mar. 24, 2011

Related U.S. Application Data

(62) Division of application No. 11/259,196, filed on Oct. 27, 2005, now Pat. No. 7,875,946.

(30) Foreign Application Priority Data

Jun. 2, 2005   (JP) ................................ 2005-162416

(51) Int. Cl.
*H01L 31/107* (2006.01)
(52) U.S. Cl.
USPC ..... 257/438; 257/466; 257/186; 257/E31.063
(58) Field of Classification Search
USPC ................ 257/186, 438, 466, 623, E31.063, 257/E29.005
See application file for complete search history.

(56) References Cited

U.S. PATENT DOCUMENTS

| | | | |
|---|---|---|---|
| 4,586,067 | A | 4/1986 | Webb |
| 4,840,916 | A | 6/1989 | Yasuda et al. |
| 5,075,750 | A | 12/1991 | Kagawa |
| 5,457,327 | A | 10/1995 | Taguchi |
| 5,610,416 | A | 3/1997 | Su et al. |
| 5,654,578 | A | 8/1997 | Watanabe |
| 5,866,936 | A | 2/1999 | Hasnain et al. |
| 6,635,908 | B2 | 10/2003 | Tanaka et al. |

FOREIGN PATENT DOCUMENTS

| | | |
|---|---|---|
| JP | 57-093584 | 6/1982 |
| JP | 60-234383 | 11/1985 |
| JP | 8-181349 | 7/1996 |
| JP | 11-354827 | 12/1999 |
| JP | 2001-196623 | 7/2001 |

OTHER PUBLICATIONS

Japanese Office Action dated Oct. 20, 2009, along with English Translation.

*Primary Examiner* — Allison P Bernstein
(74) *Attorney, Agent, or Firm* — Kratz, Quintos & Hanson, LLP

(57) ABSTRACT

In order to improve reliability by preventing an edge breakdown in a semiconductor photodetector having a mesa structure such as a mesa APD, the semiconductor photodetector includes a mesa structure formed on a first semiconductor layer of the first conduction type formed on a semiconductor substrate, the mesa structure including a light absorbing layer for absorbing light, an electric field buffer layer for dropping an electric field intensity, an avalanche multiplication layer for causing avalanche multiplication to occur, and a second semiconductor layer of the second conduction type, wherein the thickness of the avalanche multiplication layer at the portion in the vicinity of the side face of the mesa structure is made thinner than the thickness at the central portion of the mesa structure.

1 Claim, 19 Drawing Sheets

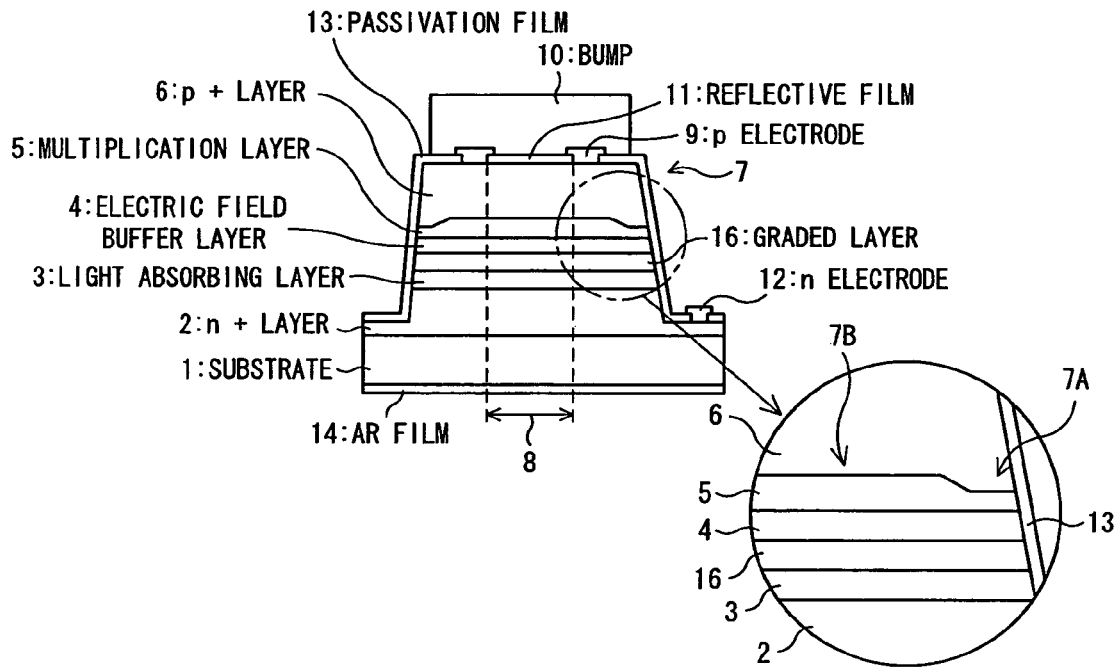
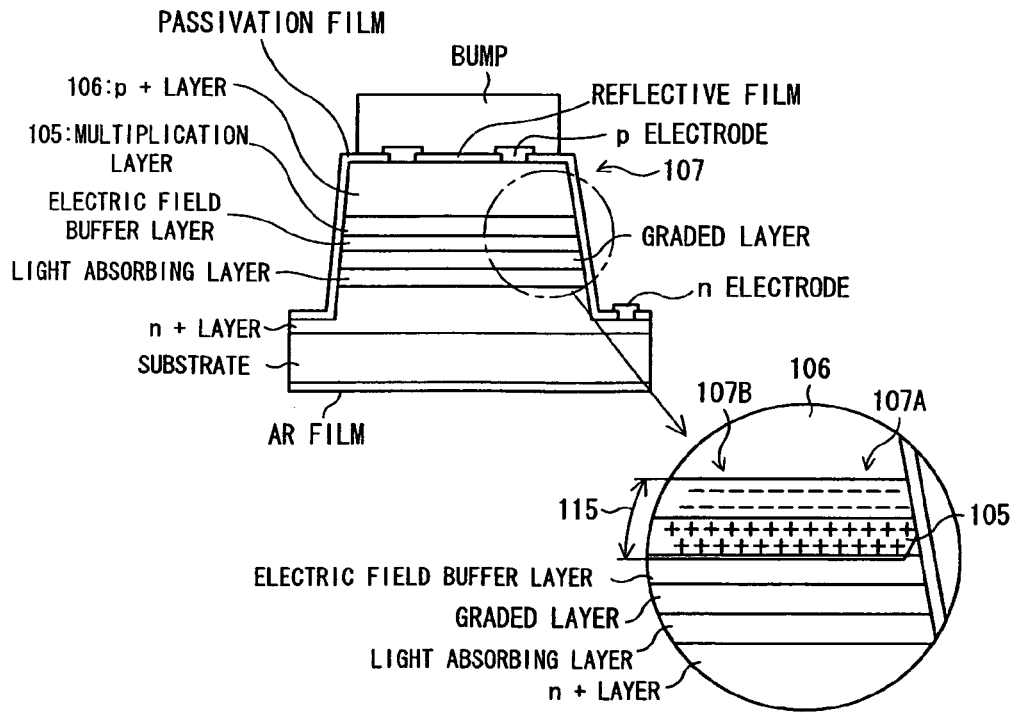

LIGHT

SEMICONDUCTOR PHOTODETECTOR THAT CAUSES AVALANCHE MULTIPLICATION TO OCCUR ONLY AT PHOTODETECTOR PORTION LOCATED AT CENTRAL PORTION OF MESA STRUCTURE

CROSS REFERENCE TO RELATED APPLICATION

This application is a divisional application of U.S. application Ser. No. 11/259,196, filed Oct. 27 2005, now U.S. Pat. No. 7,875,946 and based on and hereby claims priority to Japanese Application No. 2005-162416 filed on Jun. 2, 2005 in Japan, the contents of which are hereby incorporated by reference.

BACKGROUND OF THE INVENTION (1) Field of the Invention

The present invention relates to a semiconductor device used in, for example, an optical communication system and, more particularly, to a semiconductor photodetector and a method for manufacturing the same, suitable for use as an avalanche photo diode (APD) having a mesa structure advantageous in reducing capacitance.

(2) Description of Related Art

Recently, following a considerable increase in demand for communication due to the prevalence of the Internet, a higher-speed optical communication system is demanded. For example, a photodetective device used in an optical communication system is required to provide a data transmission rate equal to or greater than 10 Gbit/s.

For example, as a photodetective device capable of high-speed operation, an avalanche photodiode (APD) having a multiplication mechanism in its device is known.

Currently, in an optical communication system, an APD having a planar structure is mainly put into production. This is because the side of a pn junction as an operation portion is covered with a semiconductor layer and low dark current can be realized, therefore, the reliability of the device is ensured and lower noise characteristics can be realized.

As shown in FIG. 23 for example, a planar APD comprises a light absorbing layer 53 for absorbing light incident from the backside of a semiconductor substrate 51 and converting it into an electric signal and an avalanche multiplication layer 55 for multiplying an electric signal and has a structure in which a p-type semiconductor layer 56 and an n-type semiconductor layer 52 sandwich the light absorbing layer 53 and the avalanche multiplication layer 55.

In other words, as shown in FIG. 23, a planar APD has a structure, for example, in which the n-InP buffer layer 52 (Si dope; thickness 2 μm; concentration $2\times10^{18}$ cm$^{-3}$; n-type semiconductor layer), the i-InGaAs light absorbing layer 53 (undope; thickness 1 μm), an n-InP electric field buffer layer 54 (Si dope; thickness 50 nm; n-type semiconductor layer), the i-InP avalanche multiplication layer 55 (undope; thickness 100 nm), and the p-InP layer 56 (Zn dope; thickness 1 μm; concentration $1\times10^{18}$ cm$^{-3}$; p-type semiconductor layer) are stacked sequentially on the n-InP substrate 51 (Si dope; concentration $2\times10^{18}$ cm$^{-3}$; n-type semiconductor layer).

Then, on the p-InP layer 56, a p-side contact electrode 57 is further formed and a p-side electrode pad 58 is formed so as to cover the p-side contact electrode 57. On the n-InP buffer layer 52, an n-side contact electrode 59 is formed and an n-side electrode pad 60 is formed so as to cover the n-side contact electrode 59. Further, a passivation film 61 is formed so as to cover the surface. An anti-reflection film 62 is formed on the backside of the substrate. The p-side electrode pad 58 and the n-side electrode pad 60 are connected to a fixing substrate by, for example, flip-chip bonding.

While the thickness of the light absorbing layer 53 is reduced in order to enable high-speed operation, light having transmitted through the light absorbing layer 53 without being absorbed is reflected by the backside of the p-side electrode pad 58 such that it is again incident into the light absorbing layer 53, substantially doubling the thickness of the light absorbing layer 53 for incident light and thus improvement toward higher efficiency can be realized.

In order to improve the high-speed response characteristics and the low noise characteristics, a structure is employed, in which the light absorbing layer 53 and the avalanche multiplication layer 55 are separated, and thereby as shown in FIG. 24 (B), for example, the electric field intensity in the avalanche multiplication layer 55 is increased and the electric field intensity in the light absorbing layer 53 is reduced during the period of APD operation. In other words, as shown in FIG. 24 (A), for example, the film thickness and the impurity concentration of each of the p-type semiconductor layer 56, the avalanche multiplication layer 55, the electric field buffer layer 54, the light absorbing layer 53, and the n-type semiconductor layer 52 are set such that such an electric field intensity distribution in the device is obtained.

Generally, in the planar APD, the p-InP layer 56 is formed by diffusing p-type impurity (for example, Zn) into the i-InP multiplication layer 55 by carrying out selective diffusion. Due to this, such an impurity concentration as shown in FIG. 24 (A) described above is realized. Because of this, by controlling the depth of diffusion of the p-type impurity, the film thicknesses of the p-InP layer 56 and the i-InP multiplication layer 55 are controlled. In an APD having a mesa structure, which will be described later, the p-InP layer 56 and the i-InP multiplication layer 55 are formed by changing the dopant during the period of growth and such a concentration distribution as shown in FIG. 24 (A) described above is realized.

Technical documents about such a planar APD include, for example, Y. Kito et al. "High-Speed Flip-Chip InP/InGaAs Avalanche Photodiode with Ultralow Capacitance and Large Gain-Bandwidth Products" IEEE Photon. Technol. Lett. 3 1115-1116 (1991).

Currently, it has become necessary to reduce device capacitance in order to further increase the operation speed.

It is effective to employ a mesa structure as a pn junction structure in order to realize reduction in capacitance of the device. For example, when an APD has a data transmission rate (rate of information throughput) of 10 Gbit/s, the junction capacitance can be reduced by about 50% by employing a mesa structure.

The reason is as follows. The planar APD has a structure in which the p-InP layer 56 is buried in the i-InP multiplication layer 55 in contact with the n-InP electric field buffer layer 54, as described above (refer to FIG. 23), therefore, a pn junction is formed not only on the lower side face of the p-InP layer 56 but also on the lateral side face of the p-InP layer 56 and thereby a depletion layer is formed and the capacitance of this portion (fringe capacitance) is added to the junction capacitance, however, in the mesa APD, the pn junction is formed only on the lower side face of the p-InP layer 56 and therefore the depletion layer formed by this has a parallel plate shape and the fringe capacitance is not added to the junction capacitance.

Particularly, the proportion constituted by the fringe capacitance in the device capacitance increases as the device area decreases. Therefore, as the device area is reduced in an attempt to aim at higher-speed operation, the capacitance reduction effect by employing a mesa structure becomes more prominent.

Because of this, recently, the research and development of the mesa APD as a photodetective device having the high-speed response characteristics are being conducted intensively. It has become possible for the mesa APD to obtain sufficient frequency response characteristics (high-speed response characteristics) for the demand for a high transmission rate of 10 Gbit/s or higher.

The technologies about the structure of a mesa APD are disclosed in, for example, Japanese Patent Laid-Open (Kokai) HEI 8-181349, Japanese Patent Laid-Open (Kokai) HEI 11-354827, Japanese Patent Laid-Open (Kokai) 2001-196623, etc.

SUMMARY OF THE INVENTION

By the way, in the process of the research and development of such a mesa APD, it has been found that while the photodetective sensitivity distribution of the planar APD shown in FIG. 25 (A) is almost constant across the entire area as shown in FIG. 25 (B), the photodetective sensitivity distribution of the mesa APD shown in FIG. 25 (C) is higher at the portion in the vicinity of the side face of the mesa structure 63 than at the central portion (photodetective portion) as shown in FIG. 25 (D). In particular, it has been found that if the multiplication factor is increased, it becomes higher at the portion in the vicinity of the side face of the mesa structure than at the central portion. In FIG. 25 (A) to FIG. 25 (D), the same symbols are attached to the same components as those in FIG. 23.

This is because the electric field intensity at the portion in the vicinity of the side face of the mesa structure is higher than that at the central portion (photodetective portion), therefore, the breakdown voltage at the portion in the vicinity of the side face of the mesa structure becomes lower than that at the central portion and a breakdown (edge breakdown) occurs at the portion in the vicinity of the side face of the mesa structure before a breakdown occurs at the photodetective portion.

If an edge breakdown occurs first, it is not possible to sufficiently raise the electric field intensity at the photodetective portion because the increase in voltage only causes current to flow. Further, if an edge breakdown occurs at a voltage lower than the breakdown voltage at the photodetective portion, a sufficient multiplication factor cannot be obtained at the photodetective portion because the electric field intensity at the photodetective portion can not be raised sufficiently and sufficiently high photodetective sensitivity cannot be ensured, therefore, it is not possible to sufficiently function as an APD as a result.

Further, if an edge breakdown has occurred, excessive noises are caused to occur as a result, and this also raises a problem.

In the planar APD, an electric charge concentrates at the edge of the selective diffusion region and a breakdown occurs at a low voltage, therefore, a guard ring 63 is formed at the edge of the selective diffusion region as shown in FIG. 23. The guard ring 63 is formed by carrying out ion implantation of impurity (for example, Be) and by carrying out a heat treatment such that a gradual concentration gradient can be obtained. By forming such a guard ring 63, an electric charge is prevented from concentrating at the edge of the selective diffusion region and the electric field intensity that occurs at the pn junction is kept low and thus a breakdown is prevented from occurring at a low voltage.

The present invention has been developed while the above-mentioned problems being taken into consideration and an object thereof is to provide a semiconductor photodetector having a mesa structure such as a mesa APD, in which an edge breakdown is prevented from occurring and reliability can be enhanced, and a method for manufacturing the same.

Therefore, according to an aspect of the present invention, a semiconductor photodetector comprises a mesa structure formed on a first semiconductor layer of the first conduction type formed on a semiconductor substrate, the mesa structure including: a light absorbing layer for absorbing light; an electric field buffer layer for dropping an electric field intensity; an avalanche multiplication layer for causing avalanche multiplication to occur; and a second semiconductor layer of the second conduction type, wherein the thickness of the avalanche multiplication layer at the portion in the vicinity of the side face of the mesa structure is thinner than the thickness of the avalanche multiplication layer at the central portion of the mesa structure.

Alternatively, according to another aspect of the present invention, a semiconductor photodetector comprises a mesa structure formed on a first semiconductor layer of the first conduction type formed on a semiconductor substrate, the mesa structure including: a light absorbing layer for absorbing light; an electric field buffer layer for dropping an electric field intensity; an avalanche multiplication layer for causing avalanche multiplication to occur; and a second semiconductor layer of the second conduction type, wherein the electric field buffer layer has a portion in the vicinity of the side face of the mesa structure, in which the carrier concentration is lower than that in other portions.

Alternatively, according to another aspect of the present invention, a semiconductor photodetector comprises a mesa structure formed on a first semiconductor layer of the first conduction type formed on a semiconductor substrate, the mesa structure including: a light absorbing layer for absorbing light; an electric field buffer layer for dropping an electric field intensity; an avalanche multiplication layer for causing avalanche multiplication to occur; and a second semiconductor layer of the second conduction type, wherein the impurity concentration of the second semiconductor layer at the portion in the vicinity of the side face of the mesa structure and in contact with the avalanche multiplication layer is lower than the impurity concentration of the second semiconductor layer at the central portion of the mesa structure.

According to another aspect of the present invention, a method for manufacturing a semiconductor photodetector comprises the steps of: forming at least a first semiconductor layer of the first conduction type, a light absorbing layer, an electric field buffer layer, and an avalanche multiplication layer on a semiconductor substrate; doping a partial region of the avalanche multiplication layer with impurity of the second conduction type; and forming a mesa structure by carrying out mesa processing such that the region of the avalanche multiplication layer doped with the impurity of the second conduction type is located at the portion in the vicinity of side face of the mesa structure.

Alternatively, according to another aspect of the present invention, a method for manufacturing a semiconductor photodetector comprises the steps of: forming at least a first semiconductor layer of the first conduction type, a light absorbing layer, and an electric field buffer layer on a semiconductor substrate; doping a partial region of the electric field buffer layer with impurity of the second conduction type; forming at least an avalanche multiplication layer and a second semiconductor layer of the second conduction type on the electric field buffer layer; and forming a mesa structure by carrying out mesa processing such that the region of the electric field buffer layer doped with the impurity of the second conduction type is located at the portion in the vicinity of the side face of the mesa structure.

Therefore, according to a semiconductor photodetector and a method for manufacturing the same, an advantage is obtained that an edge breakdown is prevented from occurring in a semiconductor photodetector having a mesa structure such as a mesa APD and reliability can be enhanced.

BRIEF DESCRIPTION OF THE DRAWINGS

FIG. 1 is a schematic section view showing a configuration of a semiconductor photodetector according to a first embodiment of the present invention.

FIG. 2 is a schematic diagram for explaining the problems of a mesa avalanche photodiode.

DESCRIPTION OF THE PREFERRED EMBODIMENTS

Figure 3:
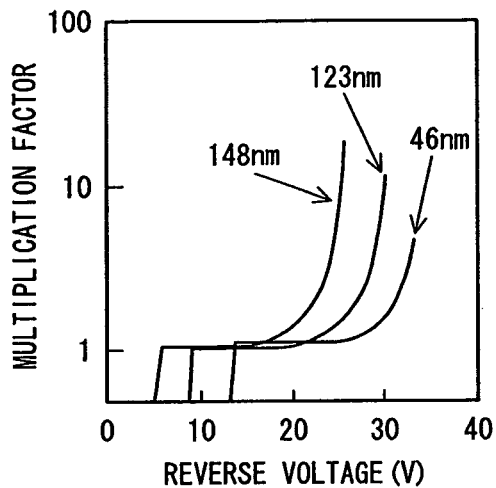
FIG. 3 is a diagram for explaining the setting of film thickness of an avalanche multiplication layer in the semiconductor photodetector according to the first embodiment of the present invention.

Semiconductor photodetectors and methods for manufacturing the same according to embodiments of the present invention are described below with reference to drawings.

[First Embodiment]

First, a semiconductor photodetector and a method for manufacturing the same according to a first embodiment of the present invention are described with reference to FIG. 1 to FIG. 6 (B).

The semiconductor photodetector according to the present embodiment is, for example, an avalanche photodiode (APD), and is configured so as to comprise, as shown in FIG. 1, a mesa structure 7 in which at least an $n^+$-InP buffer layer 2 (Si dope; concentration $1\times10^{18}$ cm$^{-3}$; n-type semiconductor layer; first semiconductor layer of the first conduction type), an i-InGaAs light absorbing layer 3 (undope; thickness 1 µm) for absorbing light, an i-InGaAsP graded layer 16 (graded composition layer, intermediate layer) for interpolating the discontinuity of the energy band between the light absorbing layer 3 and the avalanche multiplication layer 5, an $n^+$-InP electric field buffer layer 4 (Si dope; concentration $1\times10^{18}$ cm$^{-3}$; thickness 0.05 µm; n-type semiconductor layer), an i-InP avalanche multiplication layer 5 (undope; thickness 0.1 µm), and a $p^+$-InP layer 6 (Zn dope; thickness 1 µm; concentration $1\times10^{18}$ cm$^{-3}$; p-type semiconductor layer; second semiconductor layer of the second conduction type) are stacked sequentially on an $n^+$-InP substrate 1 (Si dope; concentration $1\times10^{18}$ cm$^{-3}$; n-type semiconductor substrate; first semiconductor layer of the first conduction type). Because of this, it is called a mesa APD.

Here, the light absorbing layer 3, the graded layer 16, and the avalanche multiplication layer 5 are undope semiconductor layers, however, this is not limited and, for example, they are composed of an n-type semiconductor layer of a low concentration. Further, the semiconductor substrate can be a semi-insulating semiconductor substrate. It is preferable to provide a p-type contact semiconductor layer on the $p^+$-InP layer 6.

On the p-type semiconductor layer 6 constituting the uppermost layer of the mesa structure 7, a ring-shaped p-side electrode 9 is formed around a photodetective portion 8 located at a central portion 7B of the mesa structure 7. Inside of the p-side electrode 9 on the p-type semiconductor layer 6, a reflective film (insulating film) 11 is formed. Further, on the p-side electrode 9, a bump 10 is formed. On the buffer layer 2, an n-side electrode 12 is formed. Further, a passivation film (for example, SiN film, $SiO_2$ film) 13 is formed so as to cover the surface. On the backside of the substrate 1, an anti-reflection film 14 is formed. Here, it is configured as a backside light incident type APD to which light is input from the backside of the substrate.

Here, the mesa structure 7 is configured so as to include the buffer layer 2, however, this is not limited and it can be configured so as to include, for example, the light absorbing layer 3, the graded layer 16, the electric field buffer layer 4, the avalanche multiplication layer 5, and the p-type semiconductor layer 6.

In the present embodiment, the mesa structure 7 has a regular mesa structure in which the side face inclines toward the central portion side (a structure in which the width of the mesa structure 7 becomes narrower as going toward the upward direction).

Particularly, the thickness of the avalanche multiplication layer 5 at a portion 7A in the vicinity of the side face of the mesa structure 7 is thinner than the thickness at the central portion 7B (photodetective portion 8) of the mesa structure 7.

The reason for such a configuration is as follows.

As described above, it has been found that the mesa APD has a problem of an edge breakdown and it is necessary to first make clear the mechanisms of the edge breakdown in order to solve the problem.

According to the results of the investigation of the causes of an edge breakdown conducted by the inventors of the present invention, it has been found that the shape of the mesa structure 7, in particular, the angle of the side face of the mesa structure 7 is the cause of the edge breakdown. In other words, it has been found that an edge breakdown is more likely to occur in the case of the regular mesa structure than in the case of an inverted mesa structure in which the side face of the mesa structure 7 inclines toward the outside (a structure in which the width of the mesa structure becomes wider as going toward the upward direction).

As described above, an edge breakdown occurs in the case of the regular mesa structure because, as shown in FIG. 2, in the case of the regular mesa structure, the width of a depletion layer 115 produced by pn junction in the vicinity of the interface (pn junction interface) between a p-type semiconductor layer 106 and an avalanche multiplication layer 105 becomes narrower at a portion 107A in the vicinity of the side face of a mesa structure 107, therefore, when a reverse bias voltage is applied during the period of operation, the electric field intensity at the portion 107A in the vicinity of the side face of the mesa structure 107 becomes higher than the electric field intensity at a central portion 107B (photodetective portion) of the mesa structure 107.

The reason that the width of the depletion layer 115 becomes narrower at the portion 107A in the vicinity of the side face of the mesa structure 107 in the regular mesa structure is as follows. That is, in the regular mesa structure, the side face inclines toward the central side such that the width of the mesa structure 107 becomes narrower as going toward the upward direction, therefore, the minus charges on the p region side (the p-type semiconductor layer 106 side) provided at the upper portion run short as a result. The plus charges on the n region side (the avalanche multiplication layer 105 side) decrease in number in order to compensate the shortage and, as shown in FIG. 2, the depletion layer end on the n region side comes closer to the pn junction interface at the portion 107A in the vicinity of the side face of the mesa structure 107. As a result, in the regular mesa structure, the width of the depletion layer 115 becomes narrower at the portion 107A in the vicinity of the side face of the mesa structure 107.

Therefore, in the present embodiment, in the mesa APD, as shown in FIG. 1, the mesa structure 7 is made to have a regular mesa structure such that the thickness of the avalanche multiplication layer 5 at the portion 7A in the vicinity of the side face of the mesa structure 7 is thinner than the thickness at the central portion 7B of the mesa structure 7. Due to this, the breakdown voltage at the portion 7A in the vicinity of the side face of the mesa structure 7 becomes high, therefore, it is possible to prevent an edge breakdown.

Here, FIG. 3 shows the multiplication factor voltage characteristics for each film thickness of the avalanche multiplication layer 5.

According to FIG. 3, it is found that as the film thickness of the avalanche multiplication layer 5 becomes thinner, the breakdown voltage becomes higher.

Figure 4:
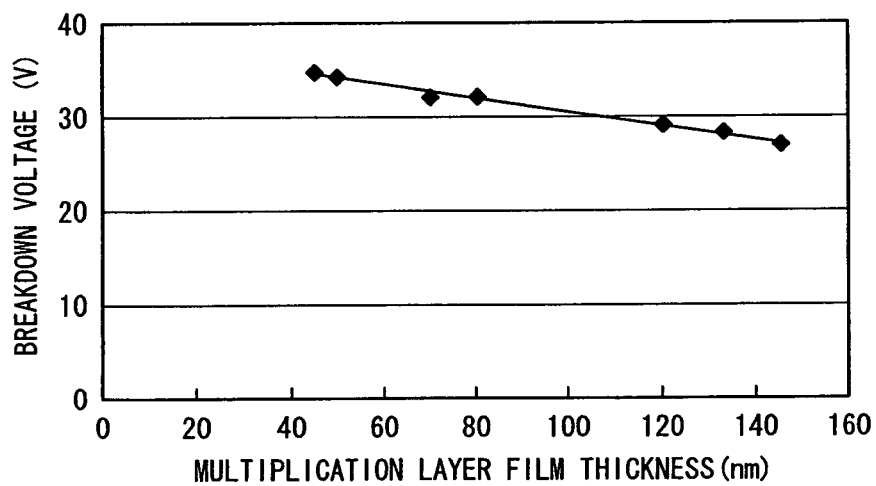
FIG. 4 is a diagram for explaining the setting of film thickness of an avalanche multiplication layer in the semiconductor photodetector according to the first embodiment of the present invention.

FIG. 4 shows the correlation between the breakdown voltage and the multiplication layer film thickness at a multiplication factor of 10.

According to FIG. 4, when the film thickness of the avalanche multiplication layer 5 at the photodetective portion 8 (the central portion 7B of the mesa structure 7) is set to 100 nm, if the film thickness of the avalanche multiplication layer 5 at the portion 7A in the vicinity of the side face of the mesa structure 7 is set to 50 nm, it is found that the breakdown voltage can be raised by about 10%.

It is possible to prevent an edge breakdown at the portion 7A in the vicinity of the side face of the mesa structure 7 by setting the thickness of the avalanche multiplication layer 5 using the relationship between the breakdown voltage and the multiplication layer film thickness.

Here, it is designed such that the thickness of the avalanche multiplication layer 5 at the portion 7A in the vicinity of the side face of the mesa structure 7 is thinner than the thickness at the central portion 7B of the mesa structure 7 by diffusing the impurity included in the p-type semiconductor layer 6 into the avalanche multiplication layer 5 at the portion 7A in the vicinity of the side face of the mesa structure 7. In other words, it is designed such that the distance between the diffusion front of the p-type semiconductor layer 6 and the n-type semiconductor layers 1 and 2 at the portion 7A in the vicinity of the side face of the mesa structure 7 is narrower than the distance at the central portion 7B (the photodetective portion 8) of the mesa structure 7 by bringing the diffusion front of the p-type semiconductor layer 6 closer to the n-type semiconductor layers 1 and 2 at the portion 7A in the vicinity of the side face of the mesa structure 7.

Here, the impurity concentration of a portion of the p-type semiconductor layer 6 at the portion which is in the vicinity of the side face 7A of the mesa structure 7 and is in contact with the avalanche multiplication layer 5 is equal to the impurity concentration at the central portion 7B of the mesa structure 7.

Next, the method for manufacturing a semiconductor photodetector according to the present embodiment is explained with reference to FIG. 5 (A) to FIG. 5 (C).

In the present embodiment, the impurity (Zn) is diffused by carrying out thermal diffusion such that the impurity concentration (Zn concentration) of the p-type semiconductor layer 6 at the portion 7A in the vicinity of the side face of the mesa structure 7 is equal to that at the central portion 7B.

This is explained specifically below.

Figure 5A:
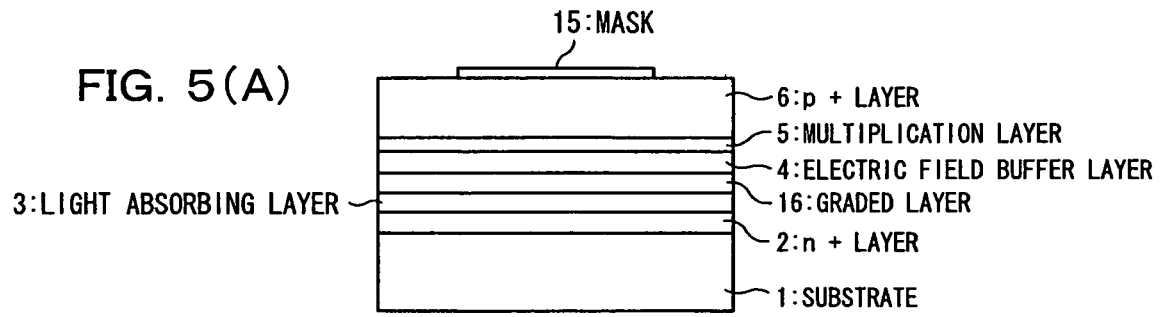
FIG. 5 (A) to FIG. 5 (C) are diagrams for explaining a method for manufacturing a semiconductor photodetector according to the first embodiment of the present invention.
Figure 5B:
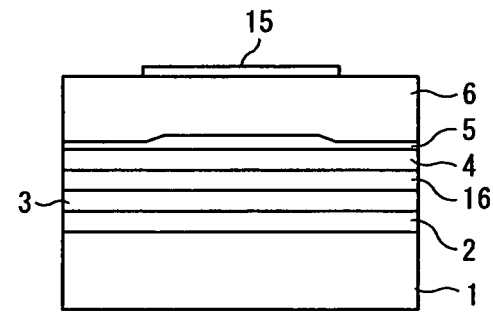
Figure 5C:
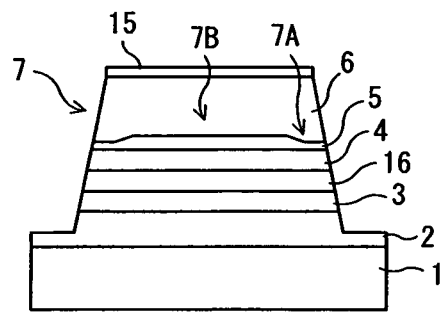

First, as shown in FIG. 5 (A), a stacking structure is formed by sequential crystal growth of at least the n$^+$-InP buffer layer 2 (Si dope; concentration $1\times10^{18}$ cm$^{-3}$; n-type semiconductor layer; first semiconductor layer of the first conduction type), the i-InGaAs light absorbing layer 3 (undope; thickness 1 μm), the i-InGaAsP graded layer 16, the n$^+$-InP electric field buffer layer 4 (Si dope; concentration $1\times10^{18}$ cm$^{-3}$; thickness 0.05 μm; n-type semiconductor layer), the i-InP avalanche multiplication layer 5 (undope; thickness 0.1 μm), and the p$^+$-InP layer 6 (Zn dope; thickness 1 μm; concentration $1\times10^{18}$ cm$^{-3}$; p-type semiconductor layer; second semiconductor layer of the second conduction type) on the n$^+$-InP substrate 1 (Si dope; concentration $1\times10^{18}$ cm$^{-3}$; n-type semiconductor substrate; first semiconductor layer of the first conduction type).

Next, as shown in FIG. 5 (A), an insulator [for example, SiN, SiO$_2$ (oxide film)] mask 15 is formed on the p-type semiconductor layer 6. The insulator mask 15 is used for diffusing p-type impurity (here, Zn) (as an annealing mask or a diffusion mask) and at the same time, is used for forming the mesa structure 7 including the photodetective portion 8 (as a mesa etching mask or a mesa processing mask). It also is possible to form the insulator mask 15 on the p-type semiconductor layer 6 via another layer.

Next, as shown in FIG. 5 (B), a heat treatment (annealing) is carried out in an atmosphere (Zn atmosphere) including the impurity (here, Zn; it could be Cd for example) included in the p-type semiconductor layer 6 using the insulator mask 15.

Here, a Zn atmosphere is an atmosphere supplying organic Zn [diethyl Zn (DEZn) or dimethyl Zn (DMZn)]. The heat treatment temperature is set to a range of 450° C. to 700° C. in which Zn can be diffused in the p-type semiconductor layer 6.

In this case, in the region in which the insulator mask 15 is formed on the surface, the diffusion of the p-type impurity from the p-type semiconductor layer 6 into the avalanche multiplication layer 5 (here, Zn diffusion) is suppressed and on the other hand, in the region on which the insulator mask 15 is not formed, the diffusion of the p-type impurity (here, Zn diffusion) from the p-type semiconductor layer 6 into the avalanche multiplication layer 5 is promoted. In this case, even in the region on which the insulator mask 15 is formed, a region adjacent to the region on which the insulator mask 15 is not formed, the diffusion of the p-type impurity (here, Zn diffusion) from the p-type semiconductor layer 6 into the avalanche multiplication layer 5 is promoted as a result. Due to this, the p-type impurity is diffused (here Zn diffusion) into a partial region of the avalanche multiplication layer 5.

Next, as shown in FIG. 5 (C), for example, mesa etching (mesa processing) is carried out using the insulator mask 15. Due to this, the mesa structure 7 having a regular mesa structure including the n-type semiconductor layers 2, the light absorbing layer 3, the graded layer 16, the electric field buffer layer 4, the avalanche multiplication layer 5, and the p-type semiconductor layer 6 is formed. Here, the mesa structure is formed by carrying out mesa processing such that the region of the avalanche multiplication layer in which the impurity has been diffused using the insulator mask 15 is located at the portion in the vicinity of the side face of the mesa structure 7.

In this case, the diffusion of the p-type impurity (here, Zn diffusion) is promoted at the portion 7A in the vicinity of the side face (in the vicinity of the mesa side) of the mesa structure 7 of the avalanche multiplication layer 5, therefore, as shown in FIG. 5 (C), the diffusion front of the p-type semiconductor layer 6 comes closer to the n-type semiconductor layers 1 and 2 at the portion 7A in the vicinity of the side face of the mesa structure 7 and as a result, the distance between the diffusion front of the p-type semiconductor layer 6 and the n-type semiconductor layers 1 and 2 at the portion 7A in the vicinity of the side face of the mesa structure 7 becomes narrower than the distance at the central portion 7B (photodetective portion) of the mesa structure 7. In other word, the thickness of the avalanche multiplication layer 5 at the portion 7A in the vicinity of the side face of the mesa structure 7 is thinner than the thickness at the central portion 7B of the mesa structure 7. Due to this, an edge breakdown does not occur because the breakdown voltage (avalanche breakdown voltage) at the portion 7A in the vicinity of the side face of the mesa structure 7 becomes higher than the breakdown voltage at the central portion 7B.

As described above, when diffusion is carried out by carrying out annealing in an atmosphere including the impurity (here, Zn) included in the p-type semiconductor layer 6 (using the Zn source), the impurity concentration at the portion 7A in the vicinity of the side face of the mesa structure 7 of the p-type semiconductor layer 6 is equal to impurity concentration at the central portion 7B of the mesa structure 7.

Then, after the insulator mask 15 is removed, the passivation film 13 (portion of it will become the reflective film 11) is formed on the entire surface so as to cover the surface (refer to FIG. 1). After this, by etching, for example, a contact hole is formed in the passivation film 13, the ring-shaped p-side electrode 9 is formed on the p-type semiconductor layer 6, and the n-side electrode 12 is formed on the buffer layer 2 (refer to FIG. 1). Next, the bump 10 is formed on the p-side electrode 9 (refer to FIG. 1). Finally, the anti-reflection film 14 is formed on the backside of the n-type semiconductor substrate 1 (refer to FIG. 1).

Here, since the passivation film 13 is configured so as to be capable of functioning as a reflective film, the passivation film 13 formed inside of the p-side electrode 9 will become the reflective film 11. Particularly, when the passivation film 13 is made to function as the reflective film 11, it is preferable to control the index of refraction and the film thickness in order to efficiently reflect light incident from the backside.

As for the size of the insulator mask 15, it is only necessary to change according to the required capacitance. For example, in order to reduce the mesa width (mesa diameter) in an attempt to reduce capacitance, it is only necessary to carry out etching with a mesa etching mask smaller in size than the annealing mask by 0.3 to 3 μm by using the mask alignment technique with a stepper.

Here, although the insulator mask is used, this is not limited. For example, a metal mask can be used. Further, the insulator mask can be configured as a multilayer structured (for example, two-layer structured) insulator film so as to be capable of functioning as a reflective film to efficiently reflect light. After used as an annealing mask and a mesa etching mask, the insulator mask will become a reflective film inside of the p-side electrode 9. In this case, it is only necessary to form the passivation film 13 in the region other than the regions inside the p-side electrode 9.

Therefore, according to the semiconductor photodetector and the method for manufacturing the same according to the present embodiment, it is possible to prevent an edge breakdown in the semiconductor photodetector having a regular mesa structure. Due to this, it becomes possible to obtain a sufficient multiplication factor in the photodetective portion 8 and to ensure sufficiently high photodetective sensitivity. As a result, the reliability of the device is improved. Further, it is possible to prevent excessive noises owing to an edge breakdown.

Figure 6A:
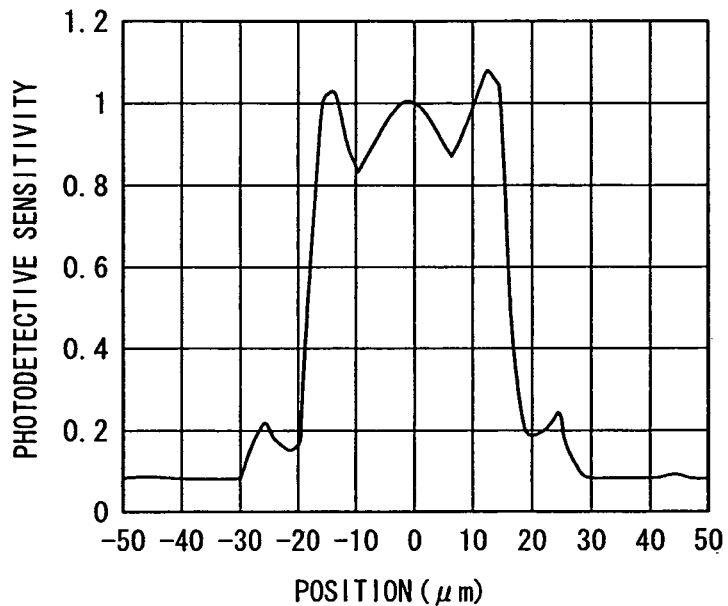
FIG. 6 (A) and FIG. 6 (B) are diagrams for explaining the effect of the semiconductor photodetector according to the first embodiment of the present invention.
Figure 6B:
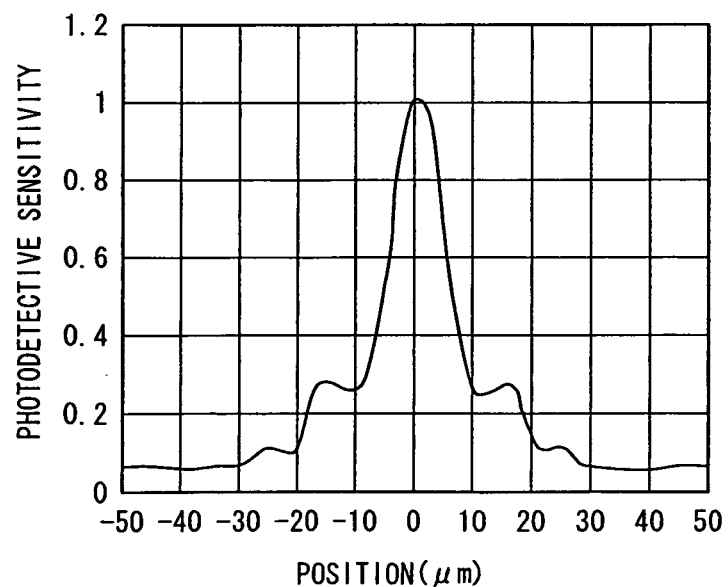

Here, FIG. 6 (A) shows the sensitivity distribution at a multiplication factor of 10 of the mesa APD to which the present invention has not been applied and FIG. 6 (B) shows the sensitivity distribution at a multiplication factor of 10 of the mesa APD to which the present invention has been applied.

As shown in FIG. 6 (A), in the structure to which the present invention has not been applied, an edge breakdown occurs and the photodetective sensitivity at the portion 7A in the vicinity of the side face of the mesa structure 7 is higher than the photodetective sensitivity at the photodetective portion 8 located at the central portion 7B. Although the probability of occurrence of such an edge breakdown differs more or less depending on the growth conditions, mesa shape, etc., an edge breakdown occurs in almost all the devices formed, particularly at the end of a wafer.

In contrast to this, as shown in FIG. 6 (B), it is found that in the structure to which the present invention has been applied, no edge breakdown occurs and multiplication is attained only at the photodetective portion 8 located at the central portion 7B and the photodetective sensitivity is high only at the photodetective portion 8. Particularly, a multiplication factor of 30 or greater can be obtained by employing the present structure. According to the present structure, the multiplication factor can be improved by three times and the sufficient characteristics as an APD can be obtained compared to the structure to which the present invention is not applied.

In the present embodiment, as a mesa etching mask, an annealing mask is used (that is, the same mask is used in the annealing process for Zn diffusion and the mesa etching process), however, this is not limited. For example, on one hand, in the annealing process, the annealing mask is formed so as to cover the region other than those in which diffusion is promoted (at least the region including the photodetective portion 8; the region capable of receiving a sufficient amount of incident light), on the other hand, in the mesa etching process, the mesa etching mask (mesa processing mask) having a width corresponding to the width of the mesa structure 7 can be formed separately from the annealing mask. In this case, it is only necessary to set the size of the mesa etching mask so as to cover at least the region covered with the annealing mask.

In the present embodiment, since the thickness of the avalanche multiplication layer 5 is thin, after the p-type semiconductor layer 6 is formed on the avalanche multiplication layer 5, annealing is carried out in an atmosphere including the impurity (here, Zn) included in the p-type semiconductor layer 6 and the p-type impurity is diffused for doping (here, Zn diffusion) from the p-type semiconductor layer 6 into the avalanche multiplication layer 5, however, this is not limited and, for example, it is also possible to dope the avalanche multiplication layer 5 at the portion 7A in the vicinity of the side face of the mesa structure 7 with the p-type impurity by carrying out thermal diffusion, ion implantation, etc., after forming the avalanche multiplication layer 5.

By the way, according to the results of the further investigation of the causes conducted by the inventors of the present invention, it has been found that an edge breakdown occurs not only in a regular mesa structure but also in a vertical mesa structure (a structure in which the width of the mesa structure is constant from the lower portion to the upper portion) or in an inverted mesa structure (a structure in which the side face inclines toward outside) although slightly.

This is thought as follows. Minus charges are stored at the interface between the passivation film 13 formed so as to cover the side face of the mesa structure 7 and the side face of the mesa structure 7 configured as the semiconductor stacking body and as a result, as in the case of the above mentioned regular mesa structure, the width of the depletion layer produced in the vicinity of the interface (pn junction interface) between the p-type semiconductor layer 6 and the avalanche multiplication layer 5 is reduced at the portion 7A in the vicinity of the side face of the mesa structure 7.

Therefore, also in the case of a vertical mesa structure in which its side face is vertical or in the case of an inverted mesa structure in which its side face inclines toward outside, as in the case of a regular mesa structure according to the above-mentioned present embodiment, it is only necessary to make the thickness of the avalanche multiplication layer 5 at the portion 7A in the vicinity of the side face of the mesa structure 7 thinner than the thickness at the central portion 7B of the mesa structure 7. By using this, also in the semiconductor photodetector having a vertical mesa structure or an inverted mesa structure, it is possible to prevent an edge breakdown.

Figure 7A:
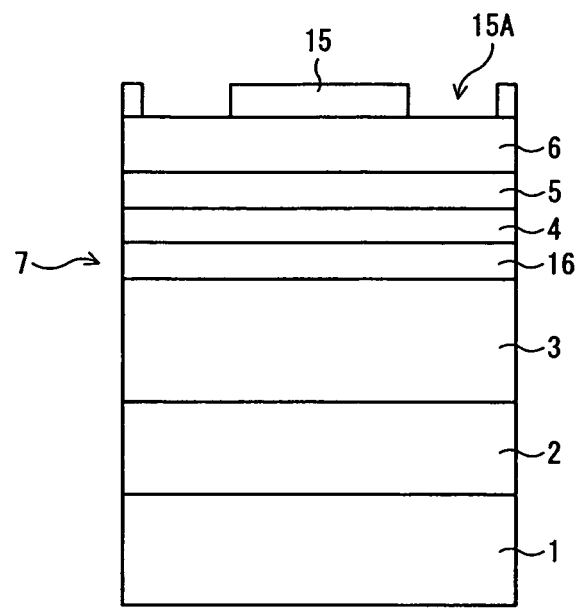
FIG. 7 (A) and FIG. 7 (B) are diagrams for explaining a modification example of the method for manufacturing a semiconductor photodetector according to the first embodiment of the present invention.
Figure 7B:
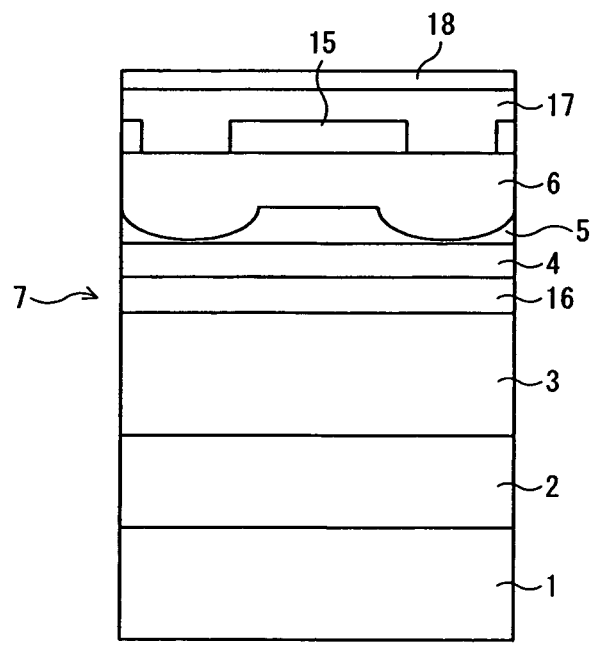

In the present embodiment, Zn is diffused by carrying out annealing in an organic Zn atmosphere, however, this is not limited. For example, it also is possible to seal ZnP powder (for example, $ZnP_2$) in a closed tube ampule under vacuum and diffuse Zn by carrying out annealing to evaporate it. Further, it also is possible to form a $ZnO_X$ film 17, after forming the annealing mask 15 having the mask window 15A as shown in FIG. 7 (A), on the annealing mask 15 such that the portion of a mask window 15A is buried, as shown in FIG. 7 (B), and further in a state of being covered with an insulating film (for example, an oxide film) 18, to diffuse Zn (solid diffusion) by carrying out annealing. FIG. 7 (A) and FIG. 7 (B) show essential portions extracted from the mesa structure 7.

[Second Embodiment]

Next, a semiconductor photodetector and a method for manufacturing the same according to a second embodiment of the present invention are described below with reference to FIG. 8 and FIG. 9 (A) to FIG. 9 (D).

The semiconductor photodetector and its manufacturing method according to the present embodiment differ from those in the above-mentioned first embodiment in that the impurity concentration of the p-type semiconductor layer at the portion in the vicinity of the side face of the mesa structure is lower than the impurity concentration at the central portion. Since the manufacturing method is different, which will be described later, the configurations of the reflective film and the p-side electrode are different.

Figure 8:
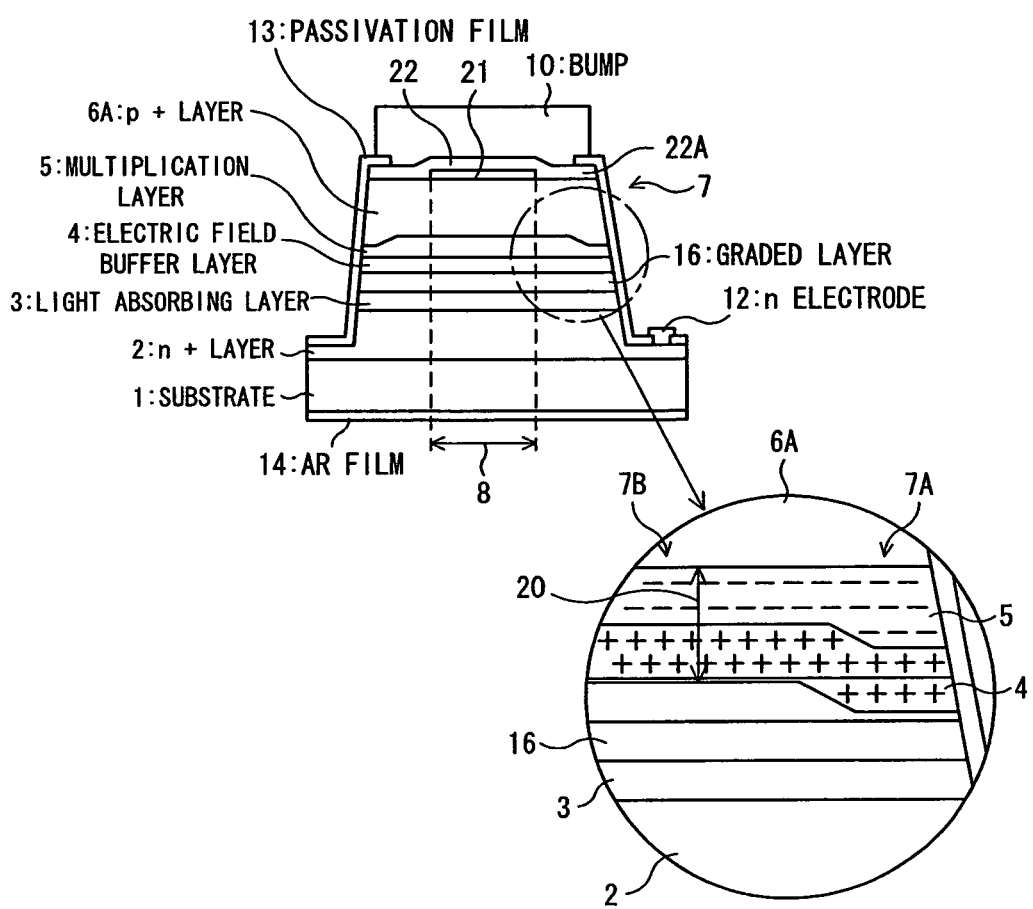
FIG. 8 is a schematic section view showing a configuration of a semiconductor photodetector according to a second embodiment of the present invention.
Figure 9A:
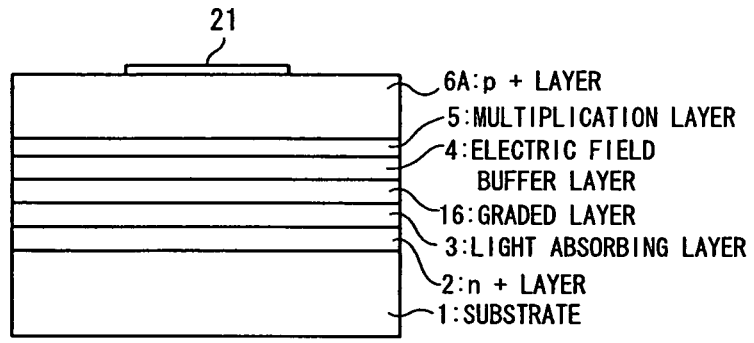
FIG. 9 (A) to FIG. 9 (D) are diagrams for explaining a method for manufacturing a semiconductor photodetector according to the second embodiment of the present invention.
Figure 9B:
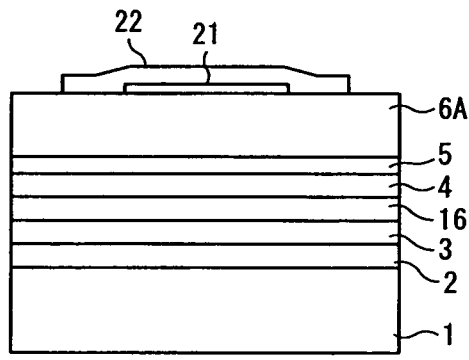
Figure 9C:
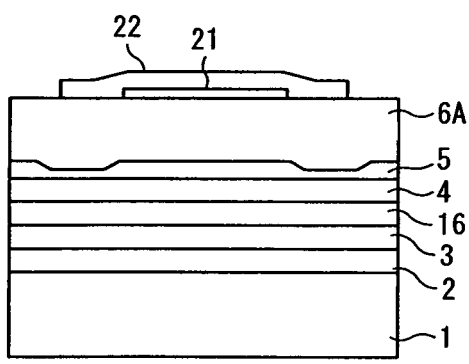
Figure 9D:
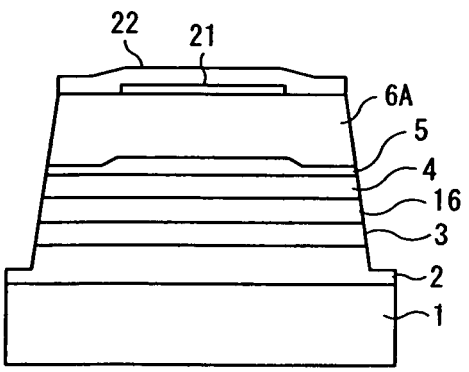

The semiconductor photodetector according to the present embodiment is, for example, an avalanche photodiode (APD) and is configured as the mesa structure 7 in which, as shown in FIG. 8, at least the $n^+$-InP buffer layer 2 (n-type semiconductor layer; first semiconductor layer of the first conduction type), the i-InGaAs light absorbing layer 3, the i-InGaAsP graded layer 16, the $n^+$-InP electric field buffer layer 4 (n-type semiconductor layer), the i-InP avalanche multiplication layer 5, and the $p^+$-InP layer 6 (p-type semiconductor layer; second semiconductor layer of the second conduction type) are stacked sequentially on the $n^+$-InP substrate 1 (n-type semiconductor substrate; first semiconductor layer of the first conduction type). Because of this, it is called a mesa APD. In FIG. 8, the same symbols are attached to the same components as those in FIG. 1.

Then, on the p-type semiconductor layer 6A constituting the uppermost layer of the mesa structure 7, an insulating film 21 is formed at the position corresponding to the photodetective portion 8. Further, a metal film 22 is formed so as to cover the insulating film 21. The portion of the metal film 22 in contact with the p-type semiconductor layer 6A functions as a p-side electrode 22A. Further, the bump 10 is formed on the metal film 22 including the p-side electrode 22A. The n-side electrode 12 is formed on the buffer layer 2. The passivation film (protective film) 13 is formed so as to cover the surface. On the backside of the substrate 1, the anti-reflection film 14 is formed. Here, the APD is configured as an APD of the backside light incident type in which light is input from the substrate backside.

Particularly, in the present embodiment, the impurity concentration of the p-type semiconductor layer 6A at the portion 7A in the vicinity of the side face of the mesa structure 7 and in contact with the avalanche multiplication layer 5 is set lower than the impurity concentration at the central portion 7B of the mesa structure 7. In other words, the impurity concentration (p carrier concentration) of the diffusion front of the p-type semiconductor layer 6A at the portion 7A (periphery of the photodetective portion 8) in the vicinity of the side face of the mesa structure 7 is set lower than the impurity concentration of the diffusion front of the p-type semiconductor layer 6A at the central portion 7B (the photodetective portion 8) of the mesa structure 7.

As described above, by reducing the diffusion front concentration of the p-type semiconductor layer 6A at the portion 7A in the vicinity of the side face of the mesa structure 7, it is possible to make the width of the depletion layer 20 at the portion 7A in the vicinity of the side face of the mesa structure 7 wider than the width of the depletion layer 20 at the central portion 7B (the photodetective portion 8), as shown in FIG. 8, and make the electric field intensity applied to the portion 7A in the vicinity of the side face of the mesa structure 7 of the avalanche multiplication layer 5 lower than the electric field intensity applied to the central portion 7B (the photodetective portion 8). As a result, since the breakdown voltage at the portion 7A in the vicinity of the side face of the mesa structure 7 is raised, it is possible to prevent an edge breakdown.

Also in this case, as shown in FIG. 8, the thickness of the avalanche multiplication layer 5 at the portion 7A in the vicinity of the side face of the 7 is thinner than the thickness at the central portion 7B of the mesa structure 7. In other words, the diffusion front of the p-type semiconductor layer 6 comes closer to the n-type semiconductor layers 1 and 2 at the portion 7A in the vicinity of the side face of the mesa structure 7 and the distance between the diffusion front of the p-type semiconductor layer 6 at the portion 7A in the vicinity of the side face of the mesa structure 7 and the n-type semiconductor layers 1 and 2 becomes smaller compared to the distance at the central portion 7B (the photodetective portion 8) of the mesa structure 7.

The details of the configuration are the same as those in the above-mentioned first embodiment, therefore, no description will be given here.

Next, the method for manufacturing a semiconductor photodetector according to the present embodiment is described below with reference to FIG. 9 (A) to FIG. 9 (D).

In the present embodiment, the impurity (Zn) is diffused by carrying out diffusion using a stress (stress diffusion) such that the impurity concentration (Zn concentration) of the p-type semiconductor layer 6A at the portion 7A in the vicinity of the side face of the mesa structure 7 is lower than that at the central portion 7B.

This is described specifically below.

First, as shown in FIG. 9 (A), a stacking structure is sequentially formed by crystal growth of at least the n$^+$-InP buffer layer 2 (Si dope; concentration $1 \times 10^{18}/cm^3$; n-type semiconductor layer; first semiconductor layer of the first conduction type), the i-InGaAs light absorbing layer 3 (undope; thickness 1 µm), the i-InGaAsP graded layer 16, the n$^+$-InP electric field buffer layer 4 (Si dope; concentration $1 \times 10^{18}/cm^3$; thickness 0.05 µm; n-type semiconductor layer), the i-InP avalanche multiplication layer 5 (undope; thickness 0.1 µm), and the p$^+$-InP layer 6A (Zn dope; thickness 1 µm; concentration $1 \times 10^{18}/cm^3$; p-type semiconductor layer; second semiconductor layer of the second conduction type) on the n$^+$-InP substrate 1 (Si dope; concentration $1 \times 10^{18}/cm^3$; n-type semiconductor substrate; first semiconductor layer of the first conduction type).

Next, as shown in FIG. 9 (A), the insulating film 21 (for example, SiN film, SiO$_2$ film, first film) that functions as a reflective film is formed in a partial region on the p-type semiconductor layer 6A so as to cover the photodetective portion 8 (refer to FIG. 8). It also is possible to form the insulating film 21 on the p-type semiconductor layer 6A via another layer.

Here, the insulating film 21 is formed of a material which does not induce a stress capable of diffusing the impurity (here, Zn; p-type impurity; impurity of the second conduction type) included in the p-type semiconductor layer 6A when annealing is carried out.

Next, the metal film 22 (metal mask, second film) is formed by, for example, evaporation, in a partial region on the p-type semiconductor layer 6A so as to cover the insulating film 21 as shown in FIG. 9 (B). The metal film 22 is used for re-diffusion of Zn (stress diffusion mask) and at the same time, is also used to form the mesa structure 7 including the photodetective portion 8 (mesa etching mask). It also is possible to form the metal film 22 on the p-type semiconductor layer 6A via another layer.

Here, the metal film 22 is formed of a metal which induces a stress capable of diffusing the impurity (here, Zn; p-type impurity; impurity of the second conduction type) included in the p-type semiconductor layer 6A when annealing is carried out. As a result, the stress that occurs in the metal film 22 when annealing is carried out is greater than the stress that occurs in the insulating film 21.

Due to this, as will be described later, when annealing is carried out, impurity diffusion (here, Zn diffusion; p-type impurity diffusion) is caused to occur in a region immediately under the region in which the metal film 22 is formed. On the other hand, impurity diffusion (here, Zn diffusion; p-type impurity diffusion) is not caused to occur in a region immediately under the region in which the metal film 22 is not formed (including the region in which the insulating film 21 is formed).

The metal film 22 functions as a mask in the manufacturing process, and it is left in the device after the device is completed, so that the portion in contact with the p-type semiconductor layer 6A functions as the p-side electrode 22A and the portion in contact with the insulating film 21 functions as a reflection film.

Next, heat treatment (annealing) is carried out in an atmosphere (Zn atmosphere) including the impurity (here, Zn; it can be Cd, for example) included in the p-type semiconductor layer 6A using the metal mask 22 as shown in FIG. 9 (C).

In this case, Zn diffusion from the p-type semiconductor layer 6A into the avalanche multiplication layer 5 is caused to occur in a region immediately under the region at which the p-type semiconductor layer 6A and the metal film 22 are in contact with each other (when the p-type semiconductor layer 6A is formed by diffusing Zn, this is Zn re-diffusion). On the other hand, Zn diffusion is not caused to occur in a region immediately under the region at which the p-type semiconductor layer 6A and the metal film 22 are not in contact with each other. The Zn concentration in the Zn re-diffusion region assumes different values depending on the process.

Next, as shown in FIG. 9 (D), mesa etching (mesa processing), for example, is carried out using the metal mask 22. By this processing, the mesa structure 7 including the n-type buffer layer 2, the light absorbing layer 3, the graded layer 16, the electric field buffer layer 4, the avalanche multiplication layer 5, and the p-type semiconductor layer 6A is formed. Here, if mesa processing is carried out using the metal mask 22, the region of the avalanche multiplication layer 5 in which the impurity has been diffused is located as a result at the portion in the vicinity of the side face of the mesa structure 7.

When diffusion is caused to occur using a stress, as described above, the impurity concentration of the p-type semiconductor layer 6A at the portion 7A in the vicinity of the side face of the mesa structure 7 is lower than the impurity concentration at the central portion 7B of the mesa structure 7. This means that the concentration gradient becomes gradual at the pn junction. Due to this, as shown in FIG. 8, at the portion 7A in the vicinity of the side face of the mesa structure 7, the width of the depletion layer 20 on the p-type semiconductor layer 6A side becomes wider than the width at the central portion 7B (the photodetective portion 8) and the electric field applied to the avalanche multiplication layer 5 is reduced at this portion. As a result, since the breakdown voltage (avalanche breakdown voltage) at the portion 7A in the vicinity of the side face of the mesa structure 7 becomes higher than the breakdown voltage at the central portion 7B, an edge breakdown is prevented from occurring.

In this case, since Zn diffusion is caused to occur at the portion 7A in the vicinity of the side face (in the vicinity of the mesa side face) of the mesa structure 7 of the avalanche multiplication layer 5, the diffusion front of the p-type semiconductor layer 6 comes closer to the n-type semiconductor layers 1 and 2 at the portion 7A in the vicinity of the side face of the mesa structure 7 and the distance between the diffusion front of the p-type semiconductor layer 6A and the n-type semiconductor layers 1 and 2 at the portion 7A in the vicinity of the side face of the mesa structure 7 becomes smaller compared to the distance at the central portion 7B (the photodetective portion 8) of the mesa structure 7. In other words, the thickness of the avalanche multiplication layer 5 at the portion 7A in the vicinity of the side face of the mesa structure 7 becomes thinner than the thickness at the central portion 7B of the mesa structure 7.

Then, after the passivation film 13 is formed on the entire surface so as to cover the surface, a contact hole that reaches the p-side electrode 22A and the n-side electrode 12 is formed in the passivation film 13 by, for example, etching (refer to FIG. 8). After this, the bump 10 is formed on the metal film 22 including the p-side electrode 22A (refer to FIG. 8). Finally, the anti-reflection film 14 is formed on the backside of the n-type semiconductor substrate 1 (refer to FIG. 8).

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion 8 and sufficiently high photodetective sensitivity can be ensured. As a result, reliability of the device is improved and it also becomes possible to prevent excessive noises owing to an edge breakdown.

In the present embodiment, since the thickness of the avalanche multiplication layer 5 is thin, after the p-type semiconductor layer 6 is formed on the avalanche multiplication layer 5, annealing is carried out in an atmosphere (Zn atmosphere) including the impurity (here, Zn) included in the p-type semiconductor layer 6A and the p-type impurity is diffused (here, Zn diffusion) from the p-type semiconductor layer 6A to the avalanche multiplication layer 5 for doping, however, this is not limited and, for example, it is also possible to dope the portion 7A in the vicinity of the side face of the mesa structure 7 of the avalanche multiplication layer 5 with p-type impurity by carrying out thermal diffusion or ion implantation.

In the present embodiment, the p-type impurity is diffused (here, Zn diffusion) to the avalanche multiplication layer 5 at the portion 7A in the vicinity of the side face of the mesa structure 7 using the stress that has occurred in the metal film 22 by annealing, however, the film used for such stress diffusion is not limited to a metal film and any film can be used provided the film induces a stress capable of diffusing impurity (here, Zn; p-type impurity; impurity of the second conduction type) included in the p-type semiconductor layer 6A when annealing is carried out. For example, a conductive film or an organic film can be used. When a film that does not function as the p-side electrode 22A is used, it is used only as a stress diffusion mask.

In the present embodiment, since the metal film 22 is left in the device after the device is completed and is used as the p-side electrode 22A, the insulating film 21 that functions as a reflective film is formed first, and then the metal film 22 is formed so as to cover the insulating film 21, however, this is not limited.

For example, it also is possible to form a film which induces a stress capable of diffusing the impurity (here, Zn; p-type impurity; impurity of the second conduction type) included in the p-type semiconductor layer 6A when annealing is carried out as a stress diffusion mask in a partial region on the p-type semiconductor layer 6A, carry out stress diffusion by carrying out annealing, and then remove the above-mentioned film as a stress diffusion mask. In this case, another mask is used as a mesa processing mask as a result. Then, it is only required to form a passivation film or an electrode as in the above-mentioned first embodiment.

Further, for example, it is also possible to form a film (first film) which does not induce a stress capable of diffusing the impurity (here, Zn; p-type impurity; impurity of the second conduction type) included in the p-type semiconductor layer 6A when annealing is carried out in a partial region on the p-type semiconductor layer 6A (for example, it can be only the region that covers the photodetective portion), to form a film (second film) which induces a stress capable of diffusing the impurity (here, Zn; p-type impurity; impurity of the second conduction type) included in the p-type semiconductor layer 6A when annealing is carried out in a partial region on the p-type semiconductor layer 6A (the region that will become the portion 7A in the vicinity of the side face of the mesa structure 7), and to carry out stress diffusion by performing an annealing using the first film and the second film as a mask.

The present embodiment can be applied to, for example, a modification example of the above-mentioned first embodiment (for example, a vertical mesa structure or an inverted mesa structure).

[Third Embodiment]

Next, a semiconductor photodetector and a method for manufacturing the same according to a third embodiment of the present invention are described with reference to FIG. 10.

The semiconductor photodetector according to the present embodiment differs from the semiconductor photodetector in the above-mentioned first embodiment in that the passivation film has a two-layer structure.

Figure 10:
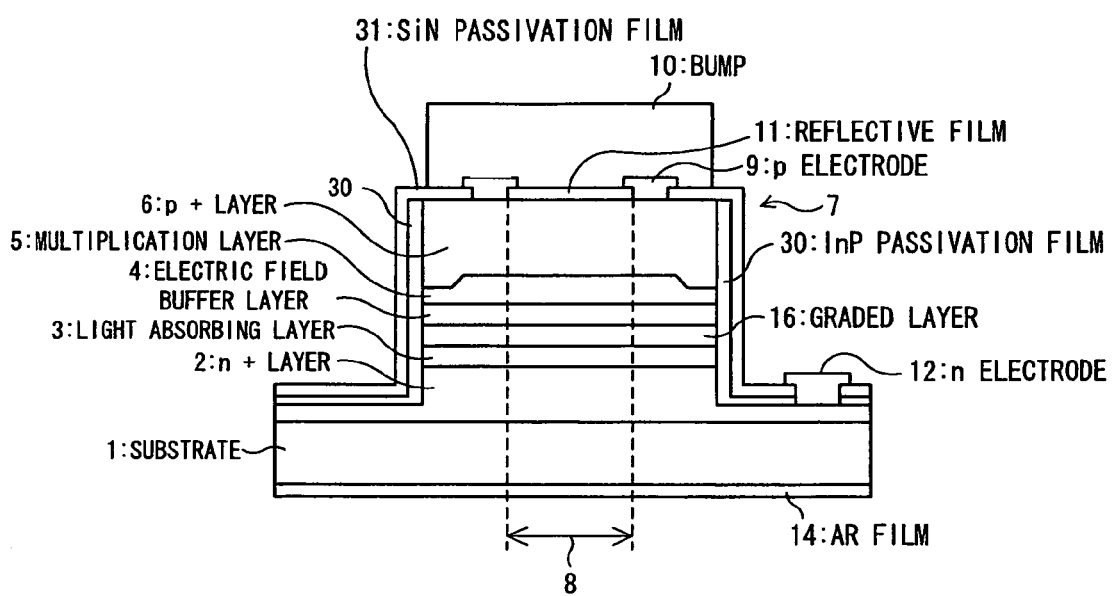
FIG. 10 is a schematic section view showing a configuration of a semiconductor photodetector according to a third embodiment of the present invention.

As shown in FIG. 10, in the present semiconductor photodetector, an i-InP passivation film 30 (intrinsic semiconductor protective film, semiconductor passivation film) is formed at the side face of the mesa structure 7 (the concentration distribution is the same as that in the above-mentioned first embodiment) formed by, for example, growth junction and the surface of the buffer layer 2, and further, an SiN passivation film (insulating protective film, insulator passivation film) 31 is formed so as to cover the entire surface [the top surface of the i-InP passivation film 30 and the mesa structure 7 (excluding the portion of the p-side electrode 9)] In FIG. 10, the same symbols are attached to the same components as those in FIG. 1.

Particularly, it is preferable for the thickness of the i-InP passivation film 30 to be not less than 30 nm and not more than 5,000 nm.

Here, the i-InP passivation film is used as the semiconductor passivation film 30, however, this is not limited and a passivation film made of another semiconductor material such as a semi-insulating (for example, Fe dope InP) passivation film can be used. Further, an SiN passivation film is used as the insulator passivation film 31, however, this is not limited and, for example, a passivation film made of an oxide film such as $SiO_2$ or an organic material film such as a polyimide film can be used.

As described above, it is possible to reduce the dark current by covering the side face of the mesa structure 7 with the semiconductor passivation film 30.

On the other hand, it is necessary to protect the top surface of the mesa structure 7. In other words, the semiconductor passivation film 30 is formed by burying-regrowth of a semiconductor layer such as an i-InP layer in a state in which a mesa etching mask is still attached after mesa etching is carried out. Due to this, the regrown interface (the interface between the mesa structure 7 and the semiconductor passivation film 30) is exposed on the top surface of the mesa structure 7 as a result. Therefore, the insulator passivation film 31 is formed so as to cover the entire surface in order to protect this portion. The insulator passivation film 31 has a function of insulating between the bump 10 and the semiconductor layers 6 and 30. Further, the insulator passivation film 31 functions as a reflective film inside the p-side electrode 9.

As described above, by using two kinds of passivation films made of different materials, higher reliability can be ensured.

Other configurations are the same as those in the above-mentioned first embodiment, therefore, no description will be given here.

Next, the method for manufacturing a semiconductor photodetector according to the present embodiment is described below with reference to FIG. 11 (A) and FIG. 11 (B).

Figure 11A:
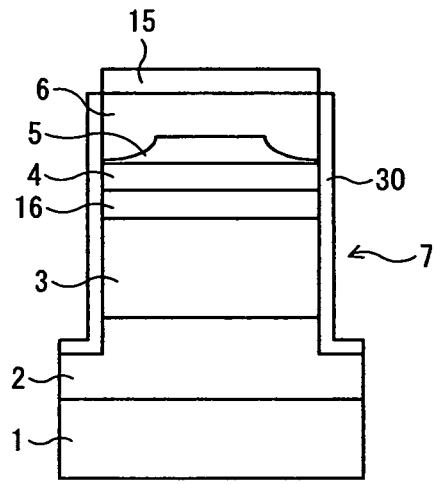
FIG. 11 (A) and FIG. 11 (B) are diagrams for explaining a method for manufacturing a semiconductor photodetector according to the third embodiment of the present invention.
Figure 11B:
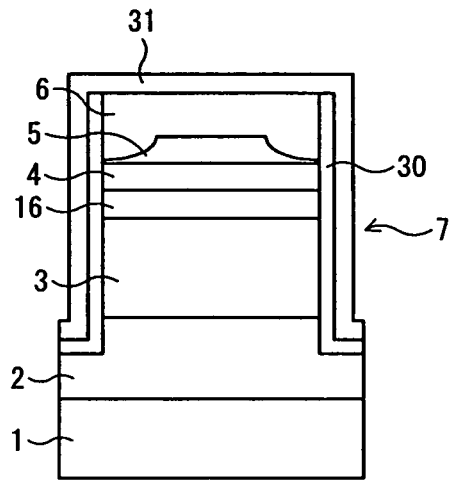

First, by the same method as that in the above-mentioned first embodiment, the mesa structure 7 including the buffer layer 2, the light absorbing layer 3, the graded layer 16, the electric field buffer layer 4, the avalanche multiplication layer 5, and the p-type semiconductor layer 6 on the semiconductor substrate 1 is formed as shown in FIG. 11 (A).

Next, as shown in FIG. 11 (A), in a state in which the insulator mask 15 used in mesa etching is attached, the i-InP passivation film 30 (intrinsic semiconductor protective film, semiconductor passivation film) is formed by selective growth so as to cover the side face of the mesa structure 7 and the surface of the buffer layer 2.

Next, as shown in FIG. 11 (B), the SiN passivation film (insulating protective film, insulator passivation film) 31 is formed so as to cover the entire surface [the top surface of the i-InP passivation film 30 and the mesa structure 7].

After this, by etching, for example, a contact hole is formed in the passivation film 31 and the p-side electrode 9 is formed on the p-type semiconductor layer 6. Further, the n-side electrode 12 is also formed. Next, the bump 10 is formed on the p-side electrode 9 (refer to FIG. 10).

Other details of the manufacturing method are the same as those in the above-mentioned first embodiment, therefore, no description will be given here.

As described above, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion 8 and ensure sufficiently high photodetective sensitivity. As a result, the reliability of the device is improved. Further, it is also possible to prevent excessive noises owing to an edge breakdown.

It also is possible to form the semiconductor passivation film 30 (here, the i-InP passivation film) in the present embodiment as one having a region into which the impurity (p-type impurity; here Zn; it can beCd, for example) included in the p-type semiconductor layer 6 (here, p$^+$-InP layer) has diffused.

Such a structure is formed in the manufacturing process by carrying out the following processes.

When the semiconductor passivation film 30 is regrown, if the side face (growth interface) of the mesa structure 7 is exposed to high temperatures, it can be damaged. In this case, it is effective to carry out heat treatment (annealing), as shown in FIG. 12 (B), after forming the insulator passivation film 31 in order to suppress the influence of the damage and ensure high reliability, as shown in FIG. 12 (A).

Annealing is carried out after the insulator passivation film 31 is formed. This is because if annealing is carried out in a state in which the semiconductor passivation film 30 is formed, the semiconductor passivation film 30 can be damaged and a leak current can be caused.

Figure 12A:
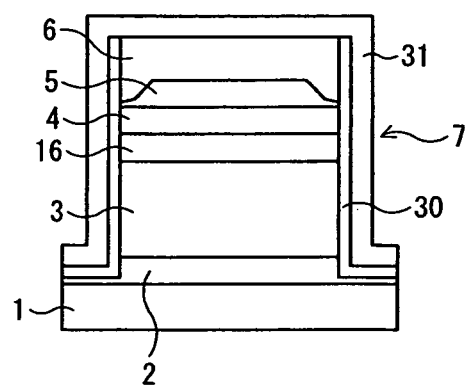
FIG. 12 (A) and FIG. 12 (B) are diagrams for explaining a modification example of the method for manufacturing a semiconductor photodetector according to the third embodiment of the present invention.
Figure 12B:
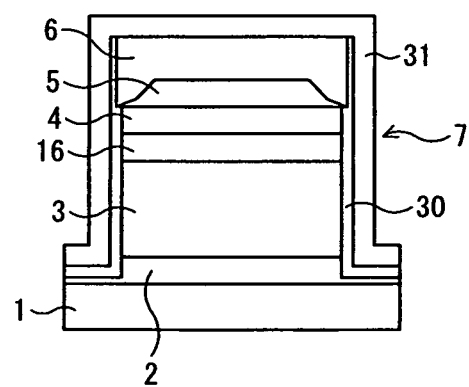

As described above, if heat treatment is carried out after the insulator passivation film 31 is formed, as shown in FIG. 12 (B), the impurity (p-type impurity; here, Zn) included in the p-type semiconductor layer 6 (here, p$^+$-InP layer) is diffused into the semiconductor passivation film (here, i-InP passivation film). As a result, the semiconductor passivation film 30 (here, i-InP passivation film) has a region (p-type inverted region) into which the impurity (p-type impurity; here, Zn) included in the p-type semiconductor layer 6 (here, p$^+$-InP layer) has diffused.

In this case, the n-type impurity included in the n-type semiconductor layer (for example, the buffer layer 2, the light absorbing layer 3, the graded layer 16, the electric field buffer layer 4, etc.) is more unlikely to diffuse by heat than the p-type impurity, therefore, the side face (the interface of the region into which the p-type impurity has diffused) of the p-type semiconductor layer 6 (here, p$^+$-InP layer) is pushed into the semiconductor passivation film 30 side with respect to the side face (regrown interface) of other layers constituting the mesa structure 7.

Due to this, it is possible to shut off the path of the leak current at the side face of the mesa structure 7 and further to suppress the leak current because the surface of the mesa structure 7 is stabilized and as a result, high reliability can be ensured.

In the present embodiment, a case where the present invention is applied to that in the above-mentioned first embodiment is explained as an example, however, this is not limited and for example, the present invention can be applied to a modification example (for example, vertical mesa structure or inverted mesa structure) of the above-mentioned first embodiment, the second embodiment, or its modification example.

[Fourth Embodiment]

Next, a semiconductor photodetector and a method for manufacturing the same according to a fourth embodiment of the present invention are described below with reference to FIG. 13.

The semiconductor photodetector according to the present embodiment differs from that in the above-mentioned first embodiment in the configuration of the passivation film.

Figure 13:
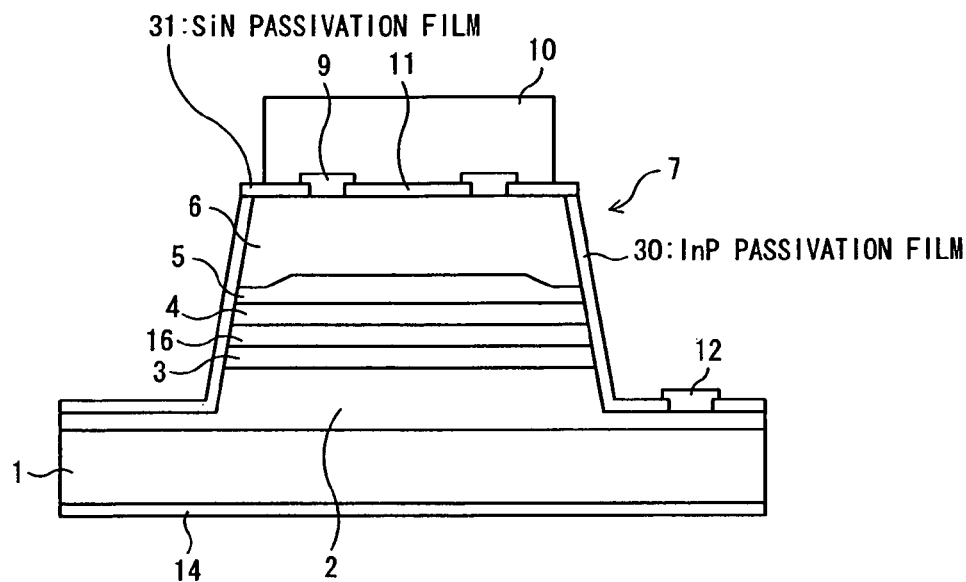
FIG. 13 is a schematic section view showing a configuration of a semiconductor photodetector according to a fourth embodiment of the present invention.

In the present semiconductor photodetector, as shown in FIG. 13, the i-InP passivation film 30 (intrinsic semiconductor protective film, semiconductor passivation film) is formed on the side face of the mesa structure 7 (the concentration distribution is the same as that in the above-mentioned first embodiment) formed by, for example, growth junction and the surface of the buffer layer 2. On the other hand, on the top surface of the mesa structure 7 including the buffer layer 2, the light absorbing layer 3, the graded layer 16, the electric field buffer layer 4, the avalanche multiplication layer 5, and the p-type semiconductor layer 6, the SiN passivation film (insulator passivation film) 31 is formed. In FIG. 13, the same symbols are attached to the same components as those in FIG. 1 and FIG. 10.

As described above, by forming the semiconductor passivation film 30 on the side face of the mesa structure 7, the initial variation in the breakdown voltage is eliminated and the state of the portion in the vicinity of the side face of the mesa structure 7 is stabilized electrically. Further, by covering the side face of the mesa structure 7 with the semiconductor passivation film 30, it is possible to reduce the dark current.

Particularly, it is preferable for the film thickness of the i-InP passivation film 30 to be not less than 30 nm and not more than 5,000 nm.

Other configurations are the same as those in the above-mentioned first embodiment, therefore, no explanation will be given here.

Next, the method for manufacturing a semiconductor photodetector according to the present embodiment is explained below.

First, by the same method as that in the above-mentioned first embodiment, the mesa structure 7 including the buffer layer 2, the light absorbing layer 3, the graded layer 16, the electric field buffer layer 4, the avalanche multiplication layer 5, and the p-type semiconductor layer 6 is formed [refer to FIG. 11 (A)].

Next, in a state in which the insulator mask 15 used in mesa etching is still attached, the i-InP passivation film 30 (intrinsic semiconductor protective film, semiconductor passivation film) is formed by selective growth so as to cover the side face of the mesa structure 7 and the surface of the buffer layer 2 [refer to FIG. 11 (A)].

Next, the SiN passivation film (insulating protective film, insulator passivation film) 31 is formed so as to cover the entire surface [refer FIG. 11 (B)].

After this, the SiN passivation film 31 formed at the portion other than the top surface of the mesa structure 7 is removed (refer to FIG. 13).

Then, a contact hole is formed in the SiN passivation film 31 and the i-InP passivation film 30, the p-side electrode 9 is formed on the p-type semiconductor layer 6, and the n-side electrode 12 is also formed on the buffer layer 2. Next, the bump 10 is formed on the p-side electrode 9 (refer to FIG. 13).

Other details of the manufacturing method are the same as those in the above-mentioned first embodiment, therefore, no explanation will be given here.

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion 8 and ensure sufficiently high photodetective sensitivity. As a result, the reliability of the device is improved. Further, it is also possible to prevent excessive noises owing to an edge breakdown.

In the present embodiment, a case where the present invention is applied to that in the above-mentioned first embodiment is explained as an example, however, this is not limited and for example, the present invention can be applied to a modification example of the above-mentioned first embodiment, the second embodiment and its modification example, or a modification example of the third embodiment.

[Fifth Embodiment]

Next, a semiconductor photodetector and a method for manufacturing the same according to a fifth embodiment of the present invention are described below with reference to FIG. 14.

The semiconductor photodetector according to the present embodiment differs from the semiconductor photodetector in the above-mentioned first embodiment in that lens processing is carried out on the backside of the substrate.

Figure 14:
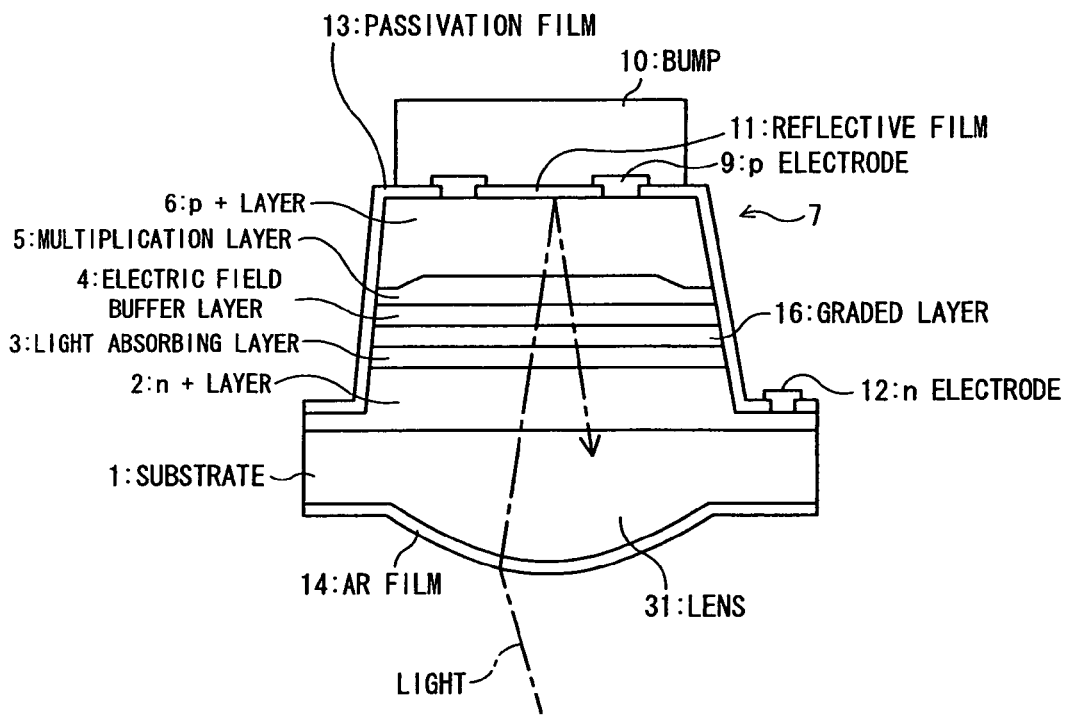
FIG. 14 is a schematic section view showing a configuration of a semiconductor photodetector according to a fifth embodiment of the present invention.

In the present semiconductor photodetector, as shown in FIG. 14, a lens 32 is provided on the backside of the semiconductor substrate 1 such that light incident from the backside of the substrate 1 is gathered by the lens 32. Due to this, the junction diameter (photodetective portion) can be reduced and it becomes possible to simultaneously realize improvements toward higher efficiency as well as higher speed. In FIG. 14, the same symbols are attached to the same components as those in FIG. 1.

Other configurations and the manufacturing method are the same as those in the above-mentioned first embodiment, therefore, no explanation will be given here.

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion and ensure sufficiently high photodetective sensitivity. As a result, the reliability of the device is improved. Further, it is also possible to prevent excessive noises owing to an edge breakdown.

Figure 15:
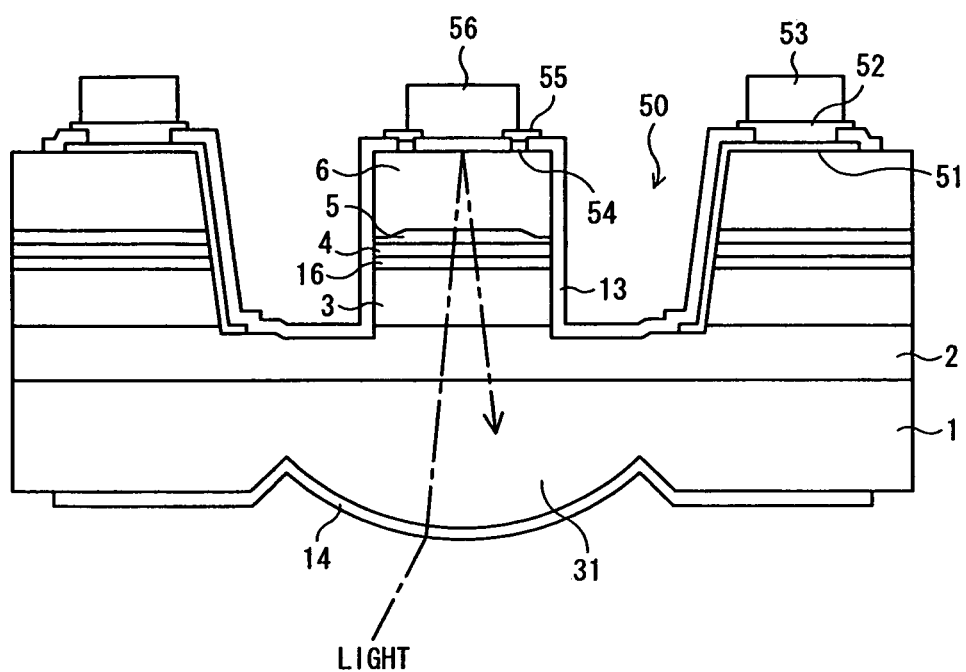
FIG. 15 is a schematic section view showing a modification example of the configuration of the semiconductor photodetector according to the fifth embodiment of the present invention.

In the present embodiment, a case where the present invention is applied to that in the above-mentioned first embodiment is explained as an example, however, this is not limited and for example, the present invention can be applied to a modification example (for example, vertical mesa structure or inverted mesa structure) of the above-mentioned first embodiment, the second embodiment, or its modification example. In the present embodiment, the above-mentioned configuration is employed, however, the configuration of an avalanche photodiode of the flip-chip mount type is not limited to this. For example, as shown in FIG. 15, it is also be possible to form a groove 50 around the mesa structure 7 such that the buffer layer 2 is exposed, form an n-side contact metal electrode 51 (for example, AuGe) along the wall surface of the groove 50 from the buffer layer 2 constituting the bottom of the groove 50 to the surface of the $p^+$-InP layer 6 and form a barrier metal layer 52 (for example, Ti/Pt) and bump 56 on the n-side contact metal electrode 51. Further, as shown in FIG. 15, it also be possible to form a p-side contact metal electrode (for example, Au/Zn/Au) on the $p^+$-InP layer 6 constituting the mesa structure 7, and form a barrier metal layer 55 (for example, Ti/Pt) and a bump 56 on the p-side contact metal electrode 54.

[Sixth Embodiment]

Next, a semiconductor photodetector and a method for manufacturing the same according to a sixth embodiment are described below with reference to FIG. 16.

The semiconductor photodetector according to the present invention differs from that in the above-mentioned first embodiment in that the structure is a surface incident type structure while it is a backside incident type structure in the above-mentioned first embodiment.

Figure 16:
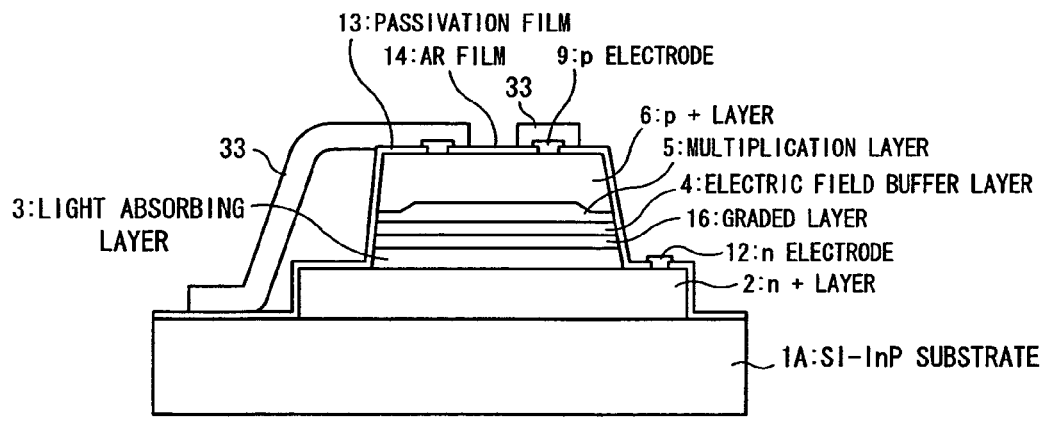
FIG. 16 is a schematic section view showing a configuration of a semiconductor photodetector according to a sixth embodiment of the present invention.

As shown in FIG. 16, the present semiconductor photodetector has a structure in which the mesa structure 7 is formed on a semi-insulating InP substrate (SI-InP substrate, semiconductor substrate) 1A via the $n^+$-InP buffer layer 2 (n-type semiconductor layer; first semiconductor layer of the first conduction type). Then, the anti-reflection film (AR film) 14 is formed at the position corresponding to the photodetective portion inside the p-side electrode 9 provided on the mesa structure 7. To the p-side electrode 9, an electrode wire (including an electrode pad) 33 having an air bridge structure is connected. In FIG. 16, the same symbols are attached to the same components as those in FIG. 1.

In the surface incident type APD configured as described above, light is input to the photodetective portion of the mesa structure 7 from the surface side via the anti-reflection film 14.

With such a surface incident type structure, although the quantum efficiency is reduced, the backside processing is not necessary, therefore, the cost can be reduced and inexpensive devices can be provided.

Other configurations and the manufacturing method are the same as those in the above-mentioned first embodiment, therefore, no explanation will be given here.

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion and ensure sufficiently high photodetective sensitivity. As a result, the reliability of the devices is improved. Further, it is also possible to prevent excessive noises owing to an edge breakdown.

In the present embodiment, a case where the present invention is applied to that in the above-mentioned first embodiment is explained as an example, however, this is not limited and for example, the present invention can be applied to a modification example (for example, vertical mesa structure or inverted mesa structure) of the above-mentioned first embodiment, the second embodiment, or its modification example.

[Seventh Embodiment]

Figure 17A:
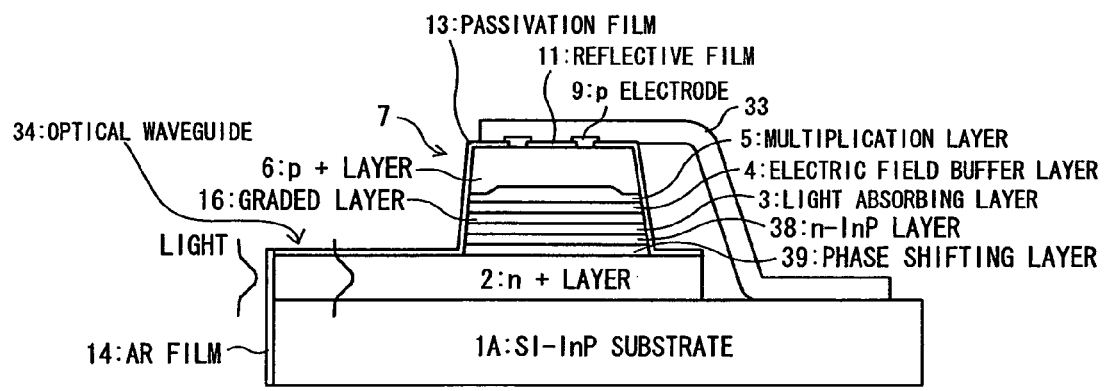
FIG. 17 (A) and FIG. 17 (B) are schematic section views showing a configuration of a semiconductor photodetector according to a seventh embodiment of the present invention.
Figure 17B:
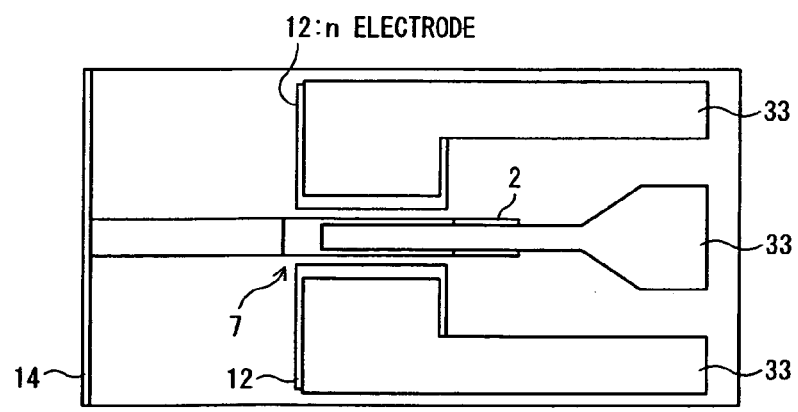

Next a semiconductor photodetector and a method for manufacturing the same according to a seventh embodiment of the present invention are described below with reference to FIG. 17 (A) and FIG. 17 (B). FIG. 17 (A) is a section view and FIG. 17 (B) is a top plan view.

The semiconductor photodetector according to the present invention differs from that in the above-mentioned first embodiment in that the structure is a backside incident type structure having an optical waveguide while it is a backside incident type structure in the above-mentioned first embodiment.

As shown in FIG. 17 (A) and FIG. 17 (B), the present semiconductor photodetector has a structure in which the mesa structure 7 is formed on the semi-insulating InP substrate (SI-InP substrate, semiconductor substrate) 1A via the $n^+$-InP buffer layer (n-type semiconductor layer; first semiconductor layer of the first conduction type) 2. In FIG. 17 (A) and FIG. 17 (B), the same symbols are attached to the same components as those in FIG. 1.

Particularly, in the present embodiment, as shown in FIG. 17 (A) and FIG. 17 (B), in addition to the above-mentioned mesa structure 7 (photodetective device), an optical waveguide 34 is also formed on the SI-InP substrate 1A and the end face of the optical waveguide 34 is connected to the side face of the $n^+$-InP buffer layer 2. In order for the $n^+$-InP buffer layer 2 to function as an optical waveguide, the $n^+$-InP buffer layer 2 also constitutes portion of the optical waveguide 34. Because of this, the mesa structure 7 is provided above the optical waveguide 34. Here, the structure is such one in which the mesa structure 7 as a photodetective device and the optical waveguide 34 are integrated monolithically.

Here, the light guided by the optical waveguide 34 is optically coupled to the photodetective portion of the mesa structure 7 as an APD operation portion by evanescent coupling. For example, as shown in FIG. 17 (A) and FIG. 17 (B), it is possible to realize a structure in which the light leaked out from the optical waveguide 34 is optically coupled to the light absorbing layer 3 efficiently by providing an n-InP layer 38 and a phase shifting layer 39 between the $n^+$-InP buffer layer 2 constituting portion of the optical waveguide 34 and the light absorbing layer 3 in this order from the light absorbing layer 3 side and by controlling the indexes of refraction of the n-InP layer 38 and the phase shifting layer 39.

On the end face (this will become the surface to which light is input) of the substrate 1A and the optical waveguide 34, the anti-reflection film (AR film) 14 is formed. Further, to the n-side electrode 12 and the p-side electrode 9, the electrode wires 33 are connected as shown in FIG. 17 (B). Among these, the electrode wire 33 connected to the p-side electrode 9 has an air bridge structure as shown in FIG. 17 (A).

In the backside incident type APD having the optical waveguide 34 thus configured, the light incident from the end face of the optical waveguide 34 is guided by the optical waveguide 34 to the lower portion of the mesa structure 7 and input to the photodetective portion of the mesa structure 7 by evanescent coupling.

The backside incident type structure having the optical waveguide 34 as described above has an advantage that local heat generation or degradation is unlikely to occur because optical coupling is gradual. There is another advantage that even when high intensity light is input, the high-speed response characteristics can be maintained. In other words, even when the intensity of the light incident to the optical waveguide 34 is high, since the light guided by the optical waveguide 34 is coupled to the light absorbing layer 3 by evanescent coupling, it is unlikely that high intensity light enters the light absorbing layer 3 locally and since the photoelectric conversion occurs over the entire light absorbing layer 3, an advantage can be obtained that a high response speed can be maintained.

Other configurations and the manufacturing method are the same as those in the above-mentioned first embodiment, therefore, no explanation will be given here.

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion and ensure sufficiently high photodetective sensitivity. As a result, the reliability of the device is improved. Further, it is also possible to prevent excessive noises owing to an edge breakdown.

In the present embodiment, a case where the present invention is applied to that in the above-mentioned first embodiment is explained as an example, however, this is not limited and for example, the present invention can be applied to a modification example (for example, vertical mesa structure or inverted mesa structure) of the above-mentioned first embodiment, the second embodiment, or its modification example.

[Eighth Embodiment]

Next a semiconductor photodetector and method for manufacturing the same according to an eighth embodiment of the present invention are described below with reference to FIG. 18 (A) to FIG. 18 (C).

Figure 18A:
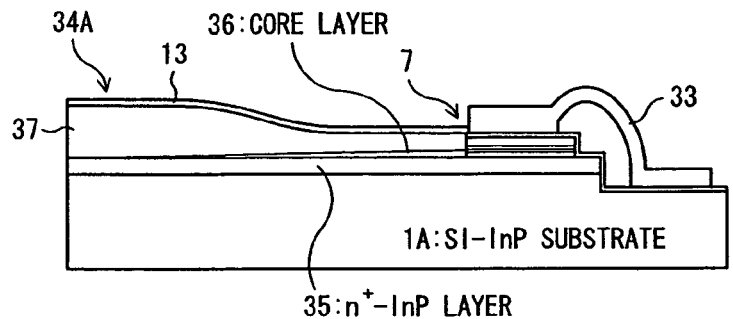
FIG. 18 (A), FIG. 18 (B), and FIG. 18 (C) are schematic section views showing a configuration of a semiconductor photodetector according to an eighth embodiment of the present invention.
Figure 18B:
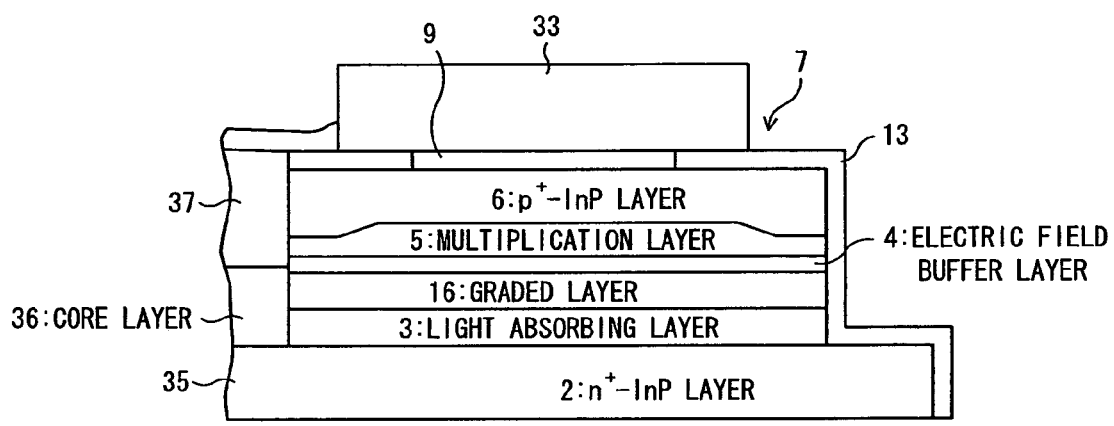
Figure 18C:
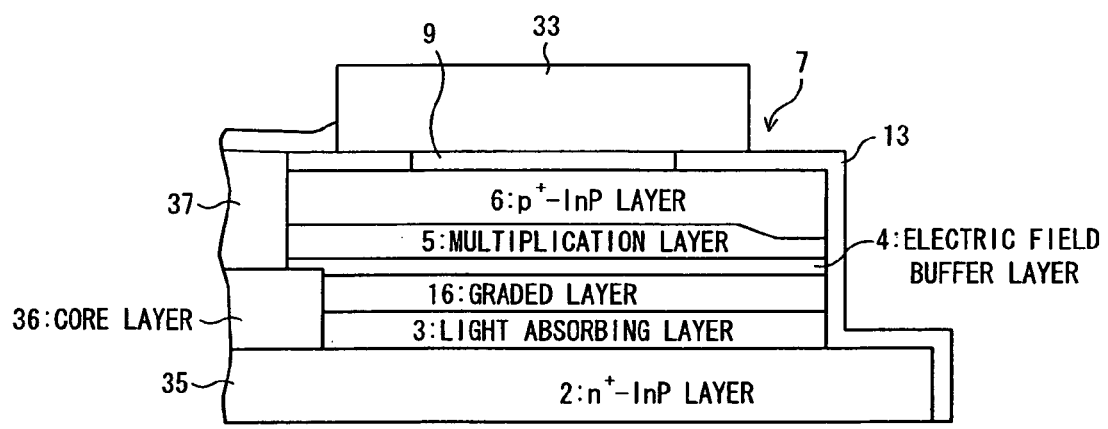

FIG. 18 (A) is a section view and FIG. 18 (B) and FIG. 18 (C) are enlarged views of the portion of the mesa structure as a photodetective device.

The semiconductor photodetector according to the present invention differs from that in the above-mentioned first embodiment in that the structure is a side face incident type structure while it is a backside incident type structure in the above-mentioned first embodiment.

As shown in FIG. 18 (A) and FIG. 18 (B), the present semiconductor photodetector has a structure in which the mesa structure 7 is formed on the semi-insulating InP substrate (SI-InP substrate, semiconductor substrate) 1A via the n⁺-InP buffer layer (n-type semiconductor layer; first semiconductor layer of the first conduction type) 2. In FIG. 18 (A) and FIG. 18 (B), the same symbols are attached to the same components as those in FIG. 1.

Particularly, in the present embodiment, as shown in FIG. 18 (A) and FIG. 18 (B), in addition to the above-mentioned mesa structure 7 (photodetective device), an optical waveguide 34A is also formed on the SI-InP substrate 1A. In other words, the structure is such one in which the mesa structure 7 as a photodetective device and the optical waveguide 34A are integrated monolithically.

Here, the optical waveguide 34A is configured by an n⁺-InP lower clad layer (n-type semiconductor layer; first semiconductor layer of the first conduction type) 35 formed on the SI-InP substrate LA, a tapered InGaAsP core layer 36 the thickness of which increases in the direction from the substrate end face toward the light absorbing layer 3 of the mesa structure 7, and an i (undope)-InP upper clad layer 37 formed so as to bury the core layer 36.

Here, an n⁺-InP layer that functions as the n⁺-InP lower clad layer 35 and the n⁺-InP buffer layer 2 is formed on the SI-InP substrate LA. On the surface of the upper clad layer 37, the passivation film 13 is formed. The p-side electrode 9 is formed not of a ring shape but of a flat shape so as to cover the photodetective portion. Further, to the p-side electrode 9, as shown in FIG. 18 (A) and FIG. 18 (B), the electrode wire 33 is connected. Among these, the electrode wire 33 connected to the p-side electrode 9 has an air-bridge structure as shown in FIG. 18 (A). Concerning with this, one disclosed in, for example, Japanese Patent Laid-Open (Kokai) 2004-54135 can be applied.

In the side face incident type APD configured as described above, light incident from the end face of the optical waveguide 34A is guided by the optical waveguide 34A to the side face of the light absorbing layer 3 constituting the mesa structure 7 and input to the photodetective portion.

Other configurations and the manufacturing method are the same as those in the above-mentioned first embodiment, therefore no explanation will be given here.

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion and ensure sufficiently high photodetective sensitivity. As a result, the reliability of the device is improved. Further, it is also possible to prevent excessive noises owing to an edge breakdown.

By the way, in the present embodiment, as in the above-mentioned first embodiment, the avalanche multiplication layer 5 is configured such that the thickness thereof at the portion 7A, in the vicinity of the side face of the mesa structure 7 is thinner than that at the central portion 7B (photodetective portion) of the mesa structure 7 and that the optical waveguide 34A is in contact with the side face of the mesa structure 7, as shown in FIG. 18 (B), however, this is not limited.

For example, as shown in FIG. 18 (C), it is also possible to configure the mesa structure 7 so as to have a cutout portion that does not have the light absorbing layer 3 and a part of the electric field buffer layer 4 at the portion in the vicinity of the junction interface with the optical waveguide 34A and such that the end portion of the core layer 36 of the optical waveguide 34A is inserted into this cutout portion. In this case, at the portion in the vicinity of the junction interface with the optical waveguide 34A, the mesa structure 7 has a structure in which a part of the electric field buffer layer 4, the avalanche multiplication layer 5, and the p-type semiconductor layer 6 are stacked on the core layer 36 of the optical waveguide 34A. Due to this, it becomes possible to prevent a breakdown at the portion in the vicinity of the junction interface with the optical waveguide 34A. Concerning this, one disclosed in, for example, Japanese Patent. Laid-Open (Kokai) 2004-207675 can be applied.

In this case, it is only necessary to configure the mesa structure 7, as shown in FIG. 18 (C), such that the thickness of the avalanche multiplication layer 5 at the portion 7A in the vicinity of the side face of the mesa structure 7 is equal to that at the central portion 7B (photodetective portion) on the side to which the optical waveguide 34A is connected and that the thickness at the portion 7A in the vicinity of the side face of the mesa structure 7 is thinner than the thickness at the central portion 7B (photodetector portion) on the side to which the optical waveguide 34A is not connected. Further, it is necessary to carry out the Zn diffusion process before forming (etching) the ridge waveguide including the optical waveguide 34A and the mesa structure 7.

In the present embodiment, a case where the present invention is applied to that in the above-mentioned first embodiment is explained as an example, however, this is not limited and for example, the present invention can be applied to a modification example (for example, vertical mesa structure or inverted mesa structure) of the above-mentioned first embodiment, the second embodiment, or its modification example.

[Ninth Embodiment]

Figure 21A:
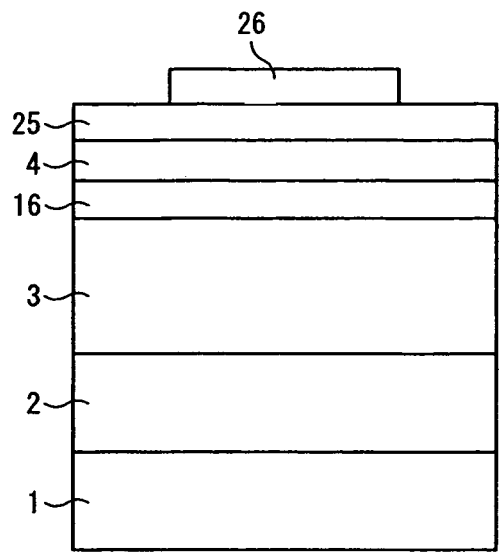
FIG. 21 (A) and FIG. 21 (B) are diagrams for explaining a modification example of the method for manufacturing a semiconductor photodetector according to the ninth embodiment of the present invention.
Figure 21B:
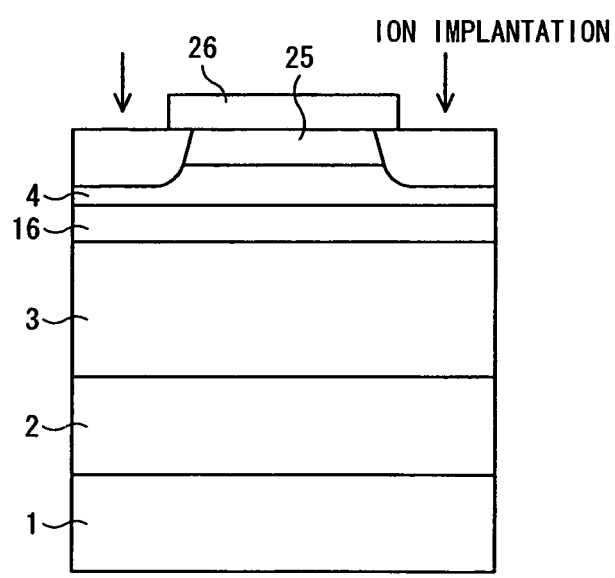
Figure 22A:
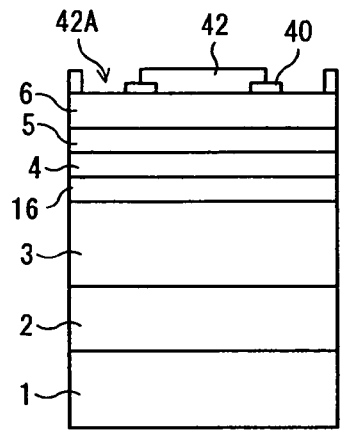
FIG. 22 (A) to FIG. 22 (F) are diagrams for explaining a method for manufacturing a semiconductor photodetector according to a tenth embodiment of the present invention.
Figure 22B:
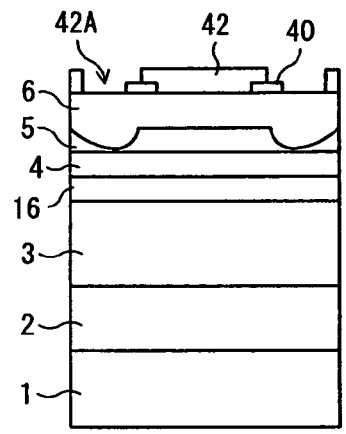
Figure 22C:
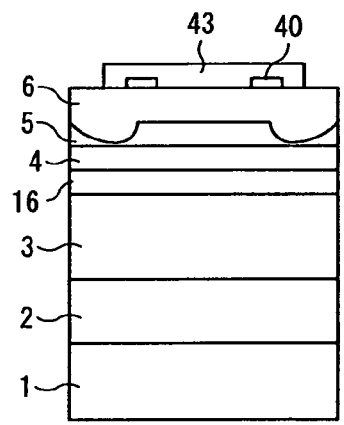
Figure 22D:
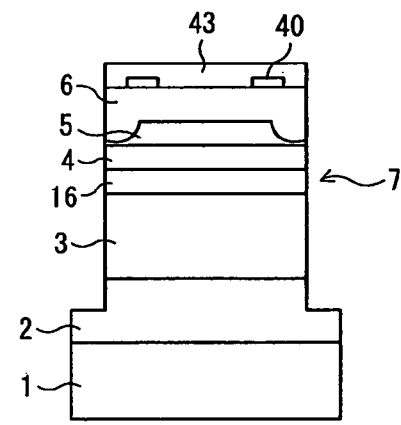
Figure 22E:
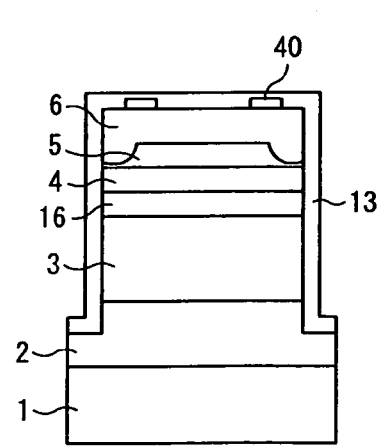
Figure 22F:
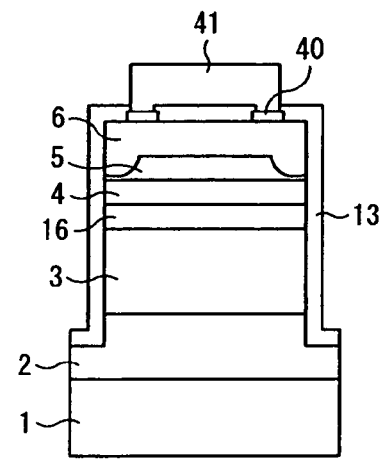
Figure 23:
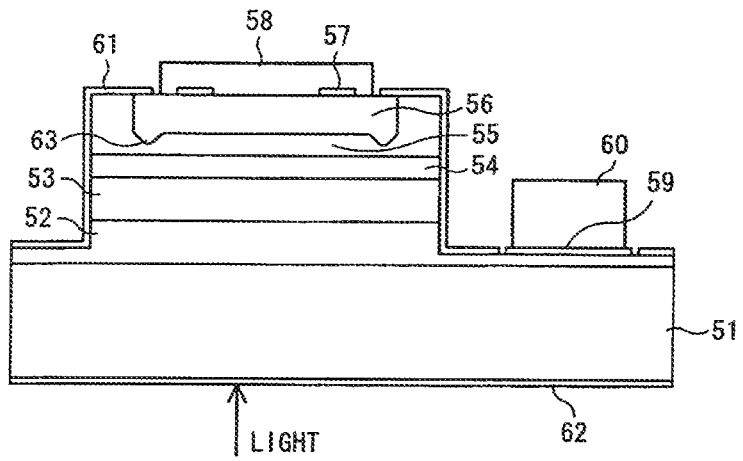
FIG. 23 is a schematic diagram showing a configuration of a conventional planar avalanche photodiode.
Figure 24A:
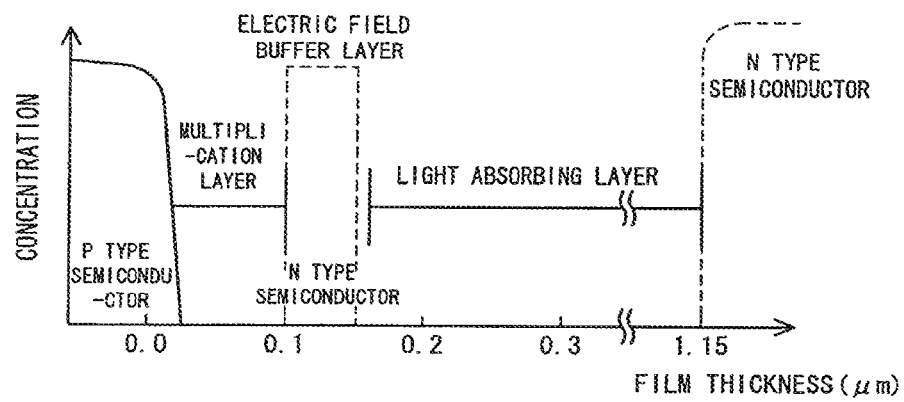
FIG. 24 (A) is a diagram showing the impurity concentration distribution in the conventional planar avalanche photodiode and FIG. 24 (B) is a diagram showing the electric field intensity distribution in the conventional planar avalanche photodiode.
Figure 24B:
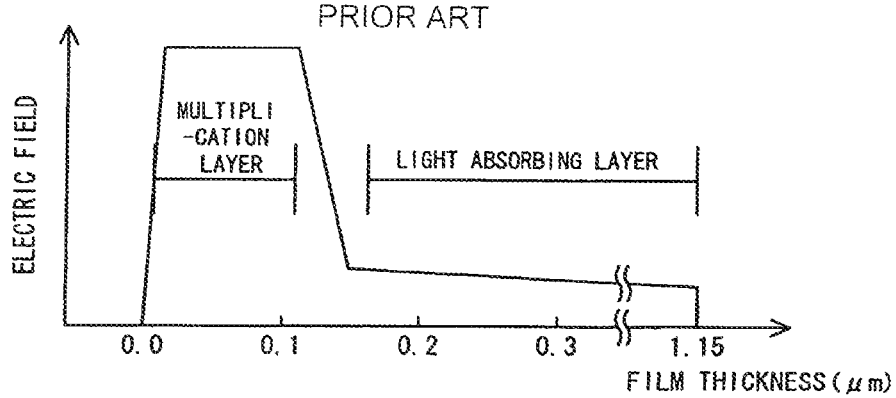
Figure 25A:
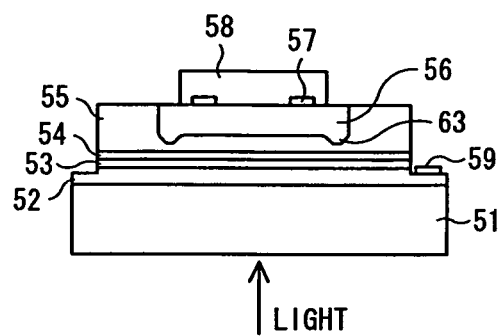
FIG. 25 (A) to FIG. 25 (D) are diagrams for explaining the problems of the mesa avalanche photodiode.
Figure 25B:
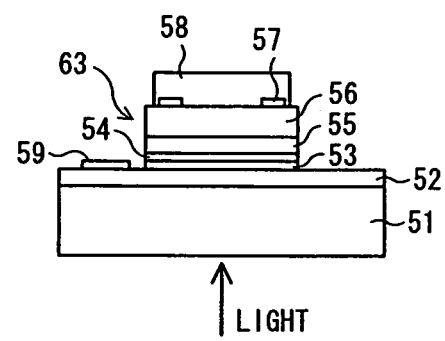
Figure 25C:
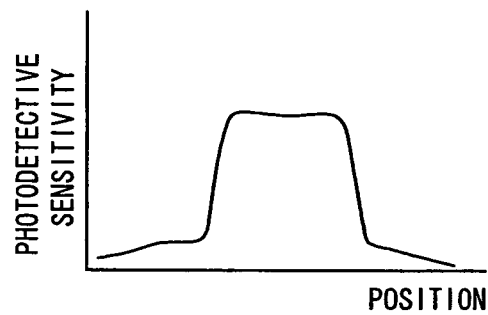
Figure 25D:
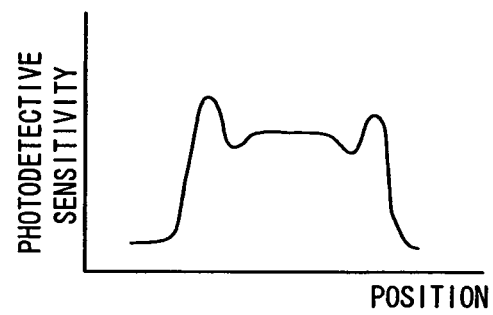

A semiconductor photodetector and a method for manufacturing the same according to a ninth embodiment of the present invention are described below with reference to FIG. 19 to FIG. 21 (A) and FIG. 21 (B).

The semiconductor photodetector according to the present embodiment differs from that in the above-mentioned first embodiment in the configurations of the avalanche multiplication layer and the electric field buffer layer.

Figure 19:
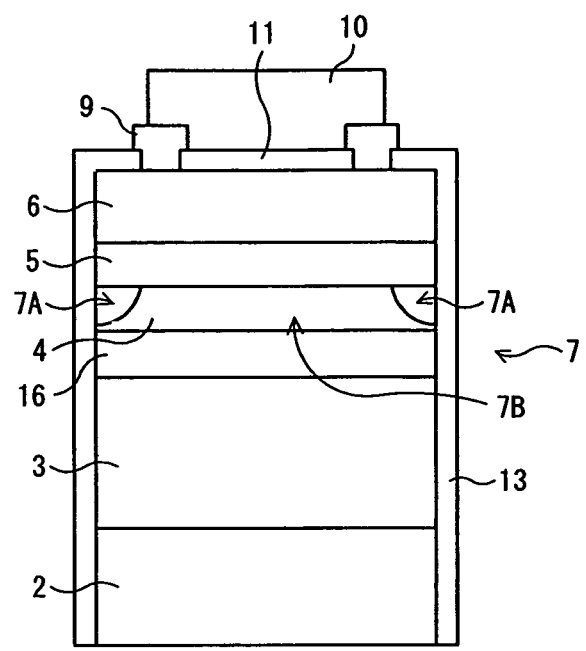
FIG. 19 is a schematic section view showing a configuration of a semiconductor photodetector according to a ninth embodiment of the present invention.
Figure 20A:
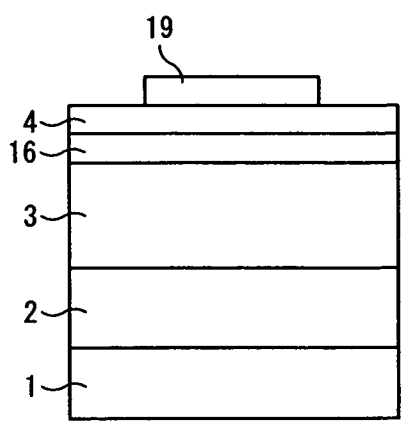
FIG. 20 (A) to FIG. 20 (D) are diagrams for explaining a method for manufacturing a semiconductor photodetector according to the ninth embodiment of the present invention.
Figure 20B:
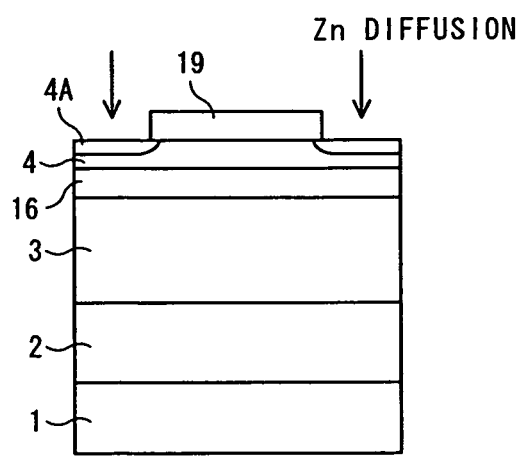
Figure 20C:
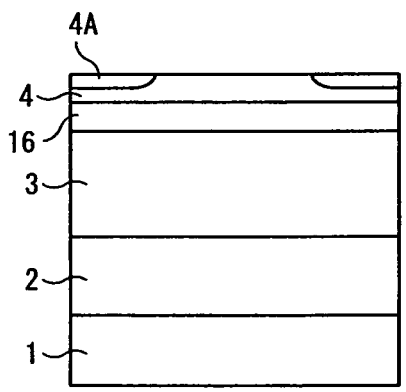
Figure 20D:
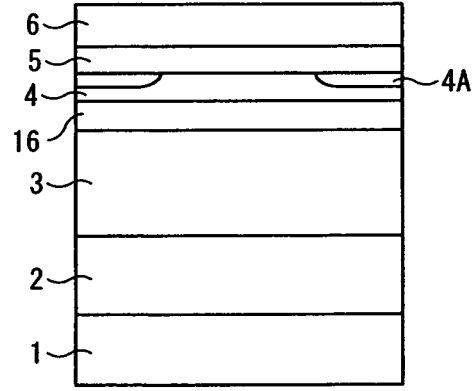

In other words, the present embodiment differs in that, as shown in FIG. 19, the thickness of the avalanche multiplication layer 5 at the portion 7A in the vicinity of the side face of the mesa structure 7 is equal to the thickness at the central portion 7B (that is, at the portion 7A in the vicinity of the side face of the mesa structure 7, the impurity included in the p-type semiconductor layer 6 has not been diffused into the avalanche multiplication layer 5) and in that the carrier concentration of the electric field buffer layer 4 is lower at the portion 7A in the vicinity of the side face of the mesa structure 7 than at other portions. In FIG. 19, only the essential portions of the mesa structure 7 are shown and the same symbols are attached to the same components as those in FIG. 1.

Here, the electric field buffer layer 4 is the n$^+$-InP electric field buffer layer 4 (Si dope; concentration 1×10$^{18}$ cm$^{-3}$; thickness 0.05 μm; n-type semiconductor layer) and the portion 7A in the vicinity of the side face of the mesa structure 7 is doped with the p-type impurity (here, Zn; it could be Cd, for example). As a result, the carrier concentration of the electric field buffer layer 4 at the portion 7A in the vicinity of the side face of the mesa structure 7 is lower than the carrier concentration at other portions.

That is, the concentration of the n-type impurity (here, Si) of the n$^+$-InP electric field buffer layer 4 at the portion 7A in the vicinity of the side face of the mesa structure 7 is equal to that at the central portion 7B, however, the concentration of the p-type impurity (here, Zn; it could be Cd, for example) at the portion 7A in the vicinity of the side face is higher than that at the central portion 7B of the mesa structure 7. Since the concentration of the p-type impurity is lower than that of the n-type impurity, the conduction type of the region doped with the p-type impurity still remains the n type.

As described above, it is possible to reduce the electric field intensity applied to the portion 7A in the vicinity of the side face of the mesa structure 7 of the avalanche multiplication layer 5 lower than the electric field intensity applied to the central portion 7B (photodetective portion) by reducing the carrier concentration of the electric field buffer layer 4 at the portion 7A in the vicinity of the side face of the mesa structure 7. As a result, since the breakdown voltage at the portion 7A in the vicinity of the side face of the mesa structure 7 becomes high, it is possible to prevent an edge breakdown.

Here, by doping the p-type impurity into the electric field buffer layer 4 which is an n-type semiconductor layer, while the electric field intensity of the light absorbing layer 3 is prevented from excessively increasing and the tunnel effect is prevented from occurring, the electric field intensity applied to the avalanche multiplication layer 5 is reduced and thus sufficient multiplication characteristics can be obtained.

Other configurations are the same as those in the above-mentioned first embodiment, therefore, no explanation will be given here.

Next, the method for manufacturing a semiconductor photodetector according to the present embodiment is described below with reference to FIG. 20 (A) to FIG. 20 (D). FIG. 20 (A) to FIG. 20 (D) show only the essential portions of the mesa structure.

First, as shown in FIG. 20 (A), at least the n$^+$-InP buffer layer 2 (Si dope; concentration 1×10$^{18}$ cm$^{-3}$; n-type semiconductor layer; first semiconductor layer of the first conduction type), the n$^-$-InGaAs light absorbing layer 3 (undope; thickness 1 μm), the n$^-$-InGaAsP graded layer 16, and the n$^+$-InP electric field buffer layer 4 (Si dope; concentration 1×10$^{18}$ cm$^{-3}$; thickness 0.05 μm; n-type semiconductor layer) are sequentially formed by crystal growth on the n$^+$-InP substrate 1 (Si dope; concentration 1×10$^{18}$ cm$^{-3}$; n-type semiconductor substrate; first semiconductor layer of the first conduction type).

Next, as shown in FIG. 20 (A), the diffusion mask 19 (insulator mask, heat-resistant mask) used for diffusing the p-type impurity (impurity of the second conduction type; here, Zn; it could be Cd, for example) is formed on the n$^+$-InP electric field buffer layer 4 so as to cover the region at least including the photodetective portion (the region that can receive a sufficient amount of incident light).

Next, as shown in FIG. 20 (B), heat treatment (annealing) is carried out in an atmosphere including the p-type impurity (here, Zn) using the diffusion mask 19 and the p-type impurity (here, Zn) is diffused into a partial region (the region that will become the portion 7A in the vicinity of the side face when the mesa structure 7 is formed) 4A of the n$^+$-InP electric field buffer layer 4.

Here, the Zn atmosphere means an atmosphere in which organic Zn [diethyl Zn (DEZn) or dimethyl Zn (DMZn)] is supplied.

After this, as shown in FIG. 20 (C), the diffusion mask 19 (or implantation mask) is removed and then, as shown in FIG. 20 (D), a stacking structure is sequentially formed by crystal growth of at least the n$^-$-InP avalanche multiplication layer 5 (undope; thickness 0.1 μm), the p$^+$-InP layer 6 (Zn dope; thickness 1 μm; concentration 1×10$^{18}$ cm$^{-3}$; p-type semiconductor layer; second semiconductor layer of the second conduction type).

Next, as in the above-mentioned first embodiment [refer to FIG. 5 (B), FIG. 5 (C)], a mesa etching mask (mesa processing mask) is formed and, for example, mesa etching (mesa processing) is carried out using this. Due to this, the mesa structure 7 including at least the n-type semiconductor layer 2, the light absorbing layer 3, graded layer 16, the electric field buffer layer 4, the avalanche multiplication layer 5, and the p-type semiconductor layer 6 is formed. Here, the mesa structure 7 is formed by carrying out mesa processing using the mesa processing mask such that the region 4A of the electric field buffer layer 4 doped with the p-type impurity (impurity of the second conduction type; here, Zn) is located at the portion 7A in the vicinity of the side face of the mesa structure 7.

Then, after the mesa etching mask is removed, the passivation film 13 (a part of it will become the reflective film 11) is formed on the entire surface so as to cover the surface. Then, by etching, for example, a contact hole is formed in the passivation film 13 and the p-side electrode 9 is formed on the p-type semiconductor layer 6. Although not shown here, the n-side electrode 12 is also formed. Next, the bump 10 is formed on the p-side electrode 9 (refer to FIG. 19).

Other details of the manufacturing method are the same as those in the above-mentioned first embodiment, therefore, no explanation will be given here.

Here, the partial region 4A of the electric field buffer layer 4 is doped with the p-type impurity (here, Zn) by thermal diffusion, however, this is not limited.

For example, it is also possible to dope the p-type impurity (here, Zn) by ion implantation. In this case, in order to prevent the electric field buffer layer 4 from being damaged at the time of ion implantation, after a semiconductor layer (dummy layer) 25 such as InGaAs or InGaAsP is formed on the electric field buffer layer 4, an implantation mask 26 (for example, an insulator mask or a mask made of an organic material such as resist) is formed so as to cover the region including at least the photodetective portion (the region that can receive a sufficient amount of incident light) as shown in FIG. 21 (A). Next, as shown in FIG. 21 (B), impurity (for example, Be) is introduced by ion implantation using the implantation mask 26 and after the implantation mask is removed, heat treatment (annealing) is carried out.

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion and ensure sufficiently high photodetective sensitivity. As a result, the reliability of the device is improved. Further, it is also possible to prevent excessive noises owing to an edge breakdown.

The present embodiment could be combined with the above-mentioned first to eighth embodiments and their modification examples. In other words, as in the above-mentioned first to eighth embodiments, it also is possible to diffuse the impurity included in the p-type semiconductor layer 6 into the avalanche multiplication layer 5 at the portion 7A in the vicinity of the side face of the mesa structure 7.

[Tenth Embodiment]

Next, a semiconductor photodetector and a method for manufacturing the same according to a tenth embodiment of the present invention are explained below with reference to FIG. 22 (A) to FIG. 22 (F).

The semiconductor photodetector according to the present embodiment differs from that in the above-mentioned first embodiment in that a p-type contact layer is provided.

In other words, in the present embodiment, a p-type semiconductor contact layer 40 is formed on the $p^+$-InP layer 6 and a p-side electrode 41 is formed on the p-type semiconductor contact layer 40 [refer to FIG. 22 (F)]. FIG. 22 (A) to FIG. 22 (F) show only the essential portions of the mesa structure (vertical mesa structure).

Next, the method for manufacturing a semiconductor photodetector according to the present embodiment is described below with reference to FIG. 22 (A) to FIG. 22 (F).

First, as shown in FIG. 22 (A), a semiconductor stacking body is formed by crystal growth of at least the $n^+$-InP buffer layer 2 (Si dope; concentration $1 \times 10^{18}$ cm$^{-3}$; n-type semiconductor layer; first semiconductor layer of the first conduction type), the i-InGaAs light absorbing layer 3 (undope; thickness 1 μm), the i-InGaAsP graded layer 16, the $n^+$-InP electric field buffer layer 4 (Si dope; concentration $1 \times 10^{18}$ cm$^{-3}$; thickness 0.05 μm; n-type semiconductor layer), the i-InP avalanche multiplication layer 5 (undope; thickness 0.1 μm), the $p^+$-InP layer 6 (Zn dope; thickness 1 μm; concentration $1 \times 10^{18}$ cm$^{-3}$; p-type semiconductor layer; second semiconductor layer of the second conduction type), and the p-type semiconductor contact layer (for example, InGaAs layer or InGaAsP layer) 40 on the $n^+$-InP substrate 1 (Si dope; concentration $1 \times 10^{18}$ cm$^{-3}$; n-type semiconductor substrate; first semiconductor layer of the first conduction type).

Here, the p-type contact layer 40 is formed into, for example a ring shape (it is a rectangular shape) such that an area capable of receiving a sufficient amount of incident light as a photodetective portion by etching after its crystal grown on the entire surface of the $p^+$-InP layer 6.

Next, as shown in FIG. 22 (A), an annealing mask 42 [insulator mask; for example, a mask made of SiN, SiO$_2$ (oxide film)] having a mask window 42A is formed on the p-type semiconductor layer 6.

Here, as shown in FIG. 22 (A), the annealing mask 42 is formed such that portion of the p-type semiconductor contact layer 40 protrudes into the mask window 42A. The annealing mask 42 is also formed at the portion in the vicinity of the end face of the semiconductor stacking body, not only in the region corresponding to the photodetective portion.

Then, as shown in FIG. 22 (B), heat treatment (annealing) is carried out using the anneal mask 42 in an atmosphere (Zn atmosphere) including the impurity (here, Zn; it can be Cd, for example) included in the p-type semiconductor layer 6. Due to this, the p-type impurity is diffused (here, Zn diffusion) into a part of the region of the avalanche multiplication layer 5.

Here, as described above, annealing is carried out by forming the p-type semiconductor contact layer 40 and the annealing mask 42. This is because as follows.

For example, when the mesa structure 7 having a small diameter (for example, the diameter is equal to 50 μm or less) is formed, if the mask window 42A is made too small in size, the diffusion region of the p-type impurity becomes too narrow and it is not possible to ensure a sufficient margin at the time of mesa etching, which will be described later.

On the other hand, if the mask window 42A is made too large, the p-type impurity is diffused into the avalanche multiplication layer 5 on the photodetective portion side more than necessary and a sufficient area of the photodetective portion cannot be ensured.

Therefore, on one hand, the size of the mask window 42A is increased to a level at which a sufficient margin can be ensured at the time of mesa etching, which will be described later, and on the other hand, the contact layer 40 composed of, for example, InGaAs or InGaAsP is provided so as to enclose the region corresponding to the photodetective portion on the avalanche multiplication layer 5 made of i-InP and the contact layer 40 is made to protrude into the mask window 42A.

In this case, since the diffusion rate of the p-type impurity (here, Zn) in the contact layer 40 is smaller than that in the avalanche multiplication layer 5, it becomes possible to prevent the diffusion region (here, Zn diffusion region) of the p-type impurity from spreading to the photodetective portion side more than necessary and ensure a sufficient size for the photodetective portion while increasing the size to a level that can ensure a sufficient margin at the time of mesa etching, which will be described later, as shown in FIG. 22 (B).

Next, after the annealing mask 42 is removed, as shown in FIG. 22 (C), the mesa etching mask (mesa processing mask) 43 is formed.

Then, using the mesa etching mask 43, as shown in FIG. 22 (D), by, for example, wet etching or dry etching, mesa etching (mesa processing) is carried out until at least the $n^+$-InP buffer layer 2. Due to this, the mesa structure 7 including the buffer layer 2, the light absorbing layer 3, the graded layer 16, the electric field buffer layer 4, the avalanche multiplication layer 5, and the p-type semiconductor layer 6 is formed. Here, the mesa structure is formed by carrying out mesa processing using the mesa etching mask 43 such that the region of the avalanche multiplication layer 5 into which the impurity has been diffused is located at the portion in the vicinity of the side face of the mesa structure 7.

Then, after the mesa etching mask 43 is removed, as shown in FIG. 22 (E), the passivation film 13 (portion of it will become the reflective film 11) is formed on the entire surface so as to cover the surface. Then, for example, by etching, a contact hole is formed in the passivation film 13 and the p-side electrode 41 is formed on the p-type semiconductor contact layer 40.

Other details of the manufacturing method are the same as those in the above-mentioned first embodiment, therefore, no explanation will be given here.

Therefore, according to the semiconductor photodetector and its manufacturing method in the present embodiment, it is possible to prevent an edge breakdown in a semiconductor photodetector having a mesa structure. Due to this, it becomes possible to obtain a sufficient multiplication factor at the photodetective portion and ensure sufficiently high photodetective sensitivity. As a result, the reliability of the device is improved. Further, it is also possible to prevent excessive noises owing to an edge breakdown.

The present embodiment can be combined with the above-mentioned first to tenth embodiments and their modification examples.

[Others]

The present invention is not limited to each of the above-mentioned embodiments and various modifications are possible without departing from the concept of the present invention. For example, the material, composition, concentration, etc. constituting the semiconductor photodetector in each of the above-mentioned embodiments are not limited to the material, composition, concentration, etc., in each of the above-mentioned embodiments.

What is claimed is:

1. A semiconductor photodetector comprising a mesa structure formed on a first semiconductor layer of the first conduction type formed on a semiconductor substrate, said mesa structure including:
   a light absorbing layer for absorbing light;
   an electric field buffer layer for dropping an electric field intensity;
   an avalanche multiplication layer for causing avalanche multiplication to occur; and
   a second semiconductor layer of the second conduction type,
   wherein said electric field buffer layer has a portion in the vicinity of the side face of said mesa structure, in which the carrier concentration is lower than that in other portions and has uniform thickness, and
   wherein said electric field buffer layer is an n-type semiconductor layer and the portion in the vicinity of the side face of said mesa structure is doped with a p-type impurity.

* * * * *